(12) United States Patent
Yang et al.

(10) Patent No.: US 11,908,790 B2
(45) Date of Patent: Feb. 20, 2024

(54) CHIP STRUCTURE WITH CONDUCTIVE VIA STRUCTURE AND METHOD FOR FORMING THE SAME

(71) Applicant: Taiwan Semiconductor Manufacturing Company, Ltd., Hsinchu (TW)

(72) Inventors: Ting-Li Yang, Tainan (TW); Po-Hao Tsai, Taoyuan (TW); Ching-Wen Hsiao, Hsinchu (TW); Hong-Seng Shue, Hsinchu County (TW); Yu-Tse Su, Chiayi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 64 days.

(21) Appl. No.: 17/142,809

(22) Filed: Jan. 6, 2021

(65) Prior Publication Data
US 2022/0216143 A1   Jul. 7, 2022

(51) Int. Cl.
| | |
|---|---|
| *H01L 21/768* | (2006.01) |
| *H01L 23/522* | (2006.01) |
| *H01L 23/00* | (2006.01) |
| *H01L 23/31* | (2006.01) |
| *H01L 23/495* | (2006.01) |
| *H01L 23/528* | (2006.01) |
| *H01L 23/532* | (2006.01) |
| *H01L 25/065* | (2023.01) |
| *H01L 21/48* | (2006.01) |

(52) U.S. Cl.
CPC ........ *H01L 23/5226* (2013.01); *H01L 21/486* (2013.01); *H01L 21/4853* (2013.01); *H01L 21/76877* (2013.01); *H01L 23/528* (2013.01); *H01L 24/14* (2013.01)

(58) Field of Classification Search
CPC ............. H01L 23/5226; H01L 21/4853; H01L 21/486; H01L 21/76877; H01L 23/528; H01L 24/14
See application file for complete search history.

(56) References Cited

U.S. PATENT DOCUMENTS

| | | | |
|---|---|---|---|
| 2004/0007779 A1* | 1/2004 | Arbuthnot | ............... H01L 24/11 257/E23.021 |
| 2007/0063352 A1 | 3/2007 | Archer, III et al. | |
| 2010/0187687 A1* | 7/2010 | Liu | ......... H01L 24/05 257/738 |

(Continued)

*Primary Examiner* — Marcos D. Pizarro
*Assistant Examiner* — Tenley H Schofield
(74) *Attorney, Agent, or Firm* — Birch, Stewart, Kolasch & Birch, LLP

(57) ABSTRACT

A chip structure is provided. The chip structure includes a substrate. The chip structure includes a conductive line over the substrate. The chip structure includes a first passivation layer over the substrate and the conductive line. The chip structure includes a conductive pad over the first passivation layer covering the conductive line. The conductive pad is thicker and wider than the conductive line. The chip structure includes a first conductive via structure and a second conductive via structure passing through the first passivation layer and directly connected between the conductive pad and the conductive line. The chip structure includes a conductive pillar over the conductive pad.

20 Claims, 41 Drawing Sheets

(56) References Cited

U.S. PATENT DOCUMENTS

| | | | | |
|---|---|---|---|---|
| 2010/0244220 A1* | 9/2010 | Chou | H01L 23/528 | |
| | | | 438/109 | |
| 2010/0263913 A1* | 10/2010 | Daubenspeck | H01L 24/03 | |
| | | | 174/250 | |
| 2010/0283149 A1* | 11/2010 | Chen | H01L 24/03 | |
| | | | 257/737 | |
| 2012/0133379 A1* | 5/2012 | Chou | H01L 24/14 | |
| | | | 257/E23.179 | |
| 2013/0134594 A1* | 5/2013 | Machida | H01L 21/768 | |
| | | | 257/772 | |
| 2013/0256893 A1* | 10/2013 | Tsai | H01L 23/5226 | |
| | | | 257/E21.59 | |
| 2013/0320524 A1* | 12/2013 | Chuang | H01L 24/13 | |
| | | | 257/737 | |
| 2017/0179059 A1* | 6/2017 | Yao | H01L 24/81 | |
| 2017/0229386 A1* | 8/2017 | Liang | H01L 23/49822 | |
| 2017/0317040 A1* | 11/2017 | Liang | H01L 23/3157 | |
| 2018/0033750 A1* | 2/2018 | Huang | H01L 23/5226 | |
| 2018/0151493 A1* | 5/2018 | Ku | H01L 28/10 | |
| 2020/0411467 A1 | 12/2020 | Yang et al. | | |

* cited by examiner

CHIP STRUCTURE WITH CONDUCTIVE VIA STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1J-1 is a top view of a region of the chip structure of FIG. 1J, in accordance with some embodiments.

DETAILED DESCRIPTION

Figure 1A:
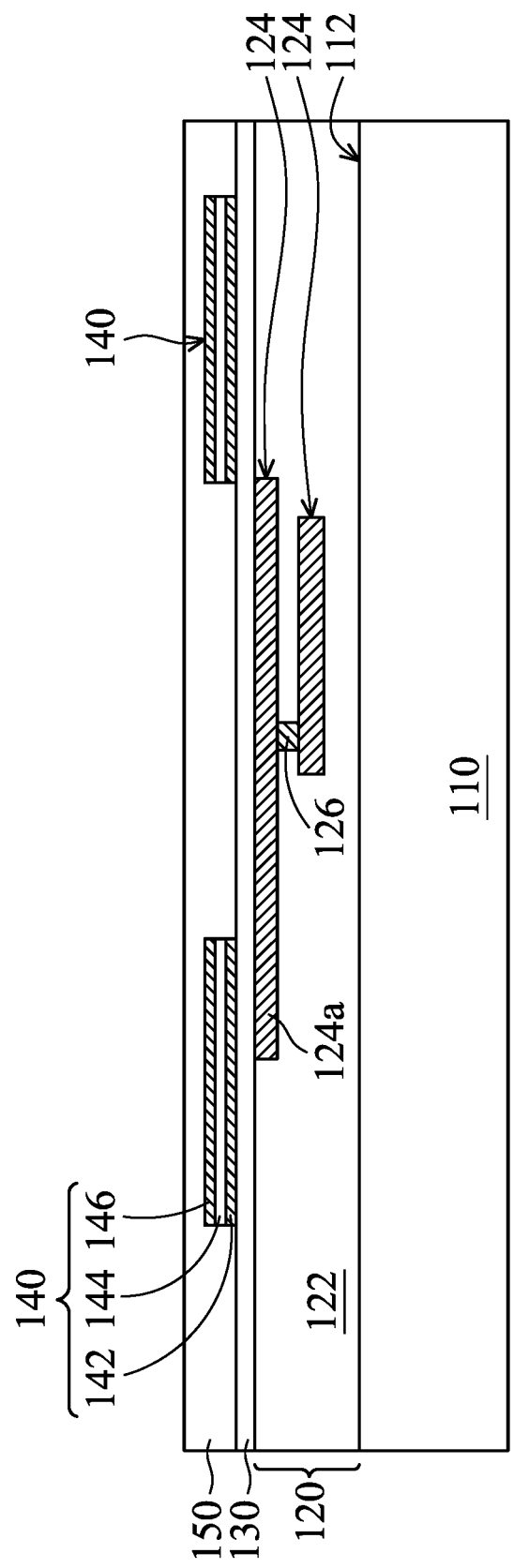
FIGS. 1A-1J are cross-sectional views of various stages of a process for forming a chip structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1J are cross-sectional views of various stages of a process for forming a chip structure, in accordance with some embodiments. As shown in FIG. 1A, a substrate 110 is provided, in accordance with some embodiments. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an interconnect structure 120 is formed over the substrate 110, in accordance with some embodiments. The interconnect structure 120 includes a dielectric structure 122, wiring layers 124, and conductive vias 126, in accordance with some embodiments. The dielectric structure 122 is formed over a surface 112 of the substrate 110, in accordance with some embodiments. The wiring layers 124 and the conductive vias 126 are formed in the dielectric structure 122, in accordance with some embodiments. Each wiring layer 124 includes conductive lines 124a, in accordance with some embodiments.

The conductive vias 126 are electrically connected between different wiring layers 124 and between the wiring layer 124 and the aforementioned device elements, in accordance with some embodiments. The dielectric structure 122 is made of an oxide-containing material (e.g. silicon oxide or undoped silicate glass) or another suitable insulating material, in accordance with some embodiments. The wiring layers 124 and the conductive vias 126 are made of conductive materials such as metal (e.g., aluminum, copper or tungsten) or alloys thereof, in accordance with some embodiments.

As shown in FIG. 1A, a passivation layer 130 is formed over the interconnect structure 120, in accordance with some embodiments. The passivation layer 130 is made of a dielectric material, such as silicon nitride, silicon oxynitride, silicon oxide, or undoped silicate glass (USG), in accordance with some embodiments. The passivation layer 130 is formed using a deposition process (e.g., a chemical vapor deposition process or a physical vapor deposition process), in accordance with some embodiments.

As shown in FIG. 1A, metal-insulator-metal (MIM) capacitors 140 are formed over the passivation layer 130, in accordance with some embodiments. Each MIM capacitor 140 includes a bottom metal layer 142, an insulating layer 144, and a top metal layer 146, in accordance with some embodiments. The insulating layer 144 is sandwiched between the bottom metal layer 142 and the top metal layer 146, in accordance with some embodiments.

The bottom metal layer 142 and the top metal layer 146 are made of titanium (Ti), titanium nitride (TiN), tantalum (Ta), tantalum nitride (TaN), copper (Cu), copper alloy, aluminum (Al), aluminum (Al) alloy, copper aluminum alloy (AlCu), tungsten (W), or tungsten (W) alloy, in accordance with some embodiments. The bottom metal layer 142 and the top metal layer 146 are formed by a procedure including depositing, photolithography, and etching processes.

The deposition processes include chemical vapor deposition (CVD), physical vapor deposition (PVD), atomic layer deposition (ALD), or applicable methods. The photolithography processes include photoresist coating (e.g., spin-on coating), soft baking, mask aligning, exposure, post-exposure baking, developing the photoresist, rinsing, and drying (e.g., hard baking), in accordance with some embodiments. The etching processes include dry etching, wet etching, and/or other etching methods.

The insulating layer 144 is made of dielectric materials, such as silicon oxide, silicon nitride or silicon glass. In some embodiments, the insulating layer 144 is formed by a chemical vapor deposition (CVD) process or physical vapor deposition (PVD) process.

As shown in FIG. 1A, a passivation layer 150 is formed over the passivation layer 130 and the MIM capacitors 140, in accordance with some embodiments. The passivation layer 150 is made of a dielectric material, such as silicon nitride, silicon oxynitride, silicon oxide, or undoped silicate glass (USG), in accordance with some embodiments. The passivation layer 150 is formed using a deposition process (e.g., a chemical vapor deposition process or a physical vapor deposition process), in accordance with some embodiments.

Figure 1B:
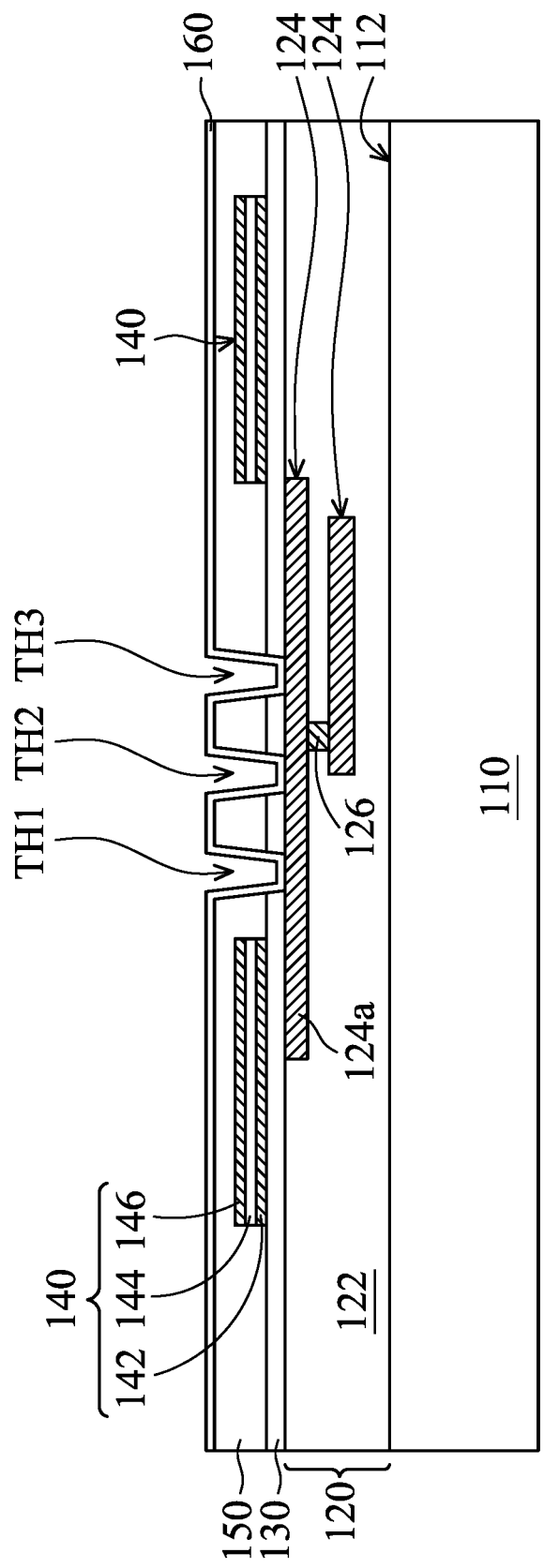

As shown in FIG. 1B, portions of the passivation layers 130 and 150 are removed to form through holes TH1, TH2, and TH3 in the passivation layers 130 and 150, in accordance with some embodiments. The through holes TH1, TH2, and TH3 expose portions of the conductive line 124a of the topmost wiring layer 124, in accordance with some embodiments. The removal process includes a photolithography process and an etching process, such as a dry etching process, in accordance with some embodiments.

In some embodiments (not shown), a barrier layer is formed over the passivation layer 150 and in the through holes TH1, TH2, and TH3. The barrier layer is made of nitrides such as tantalum nitride (TaN), in accordance with some embodiments. In some embodiments, the barrier layer is a multilayer structure including a tantalum layer and a tantalum nitride layer over the tantalum layer. The barrier layer is formed using a deposition process, such as a physical vapor deposition (PVD) process, a chemical vapor deposition (CVD) process, or an atomic layer deposition (ALD) process, in accordance with some embodiments.

As shown in FIG. 1B, a seed layer 160 is conformally formed over the barrier layer, in accordance with some embodiments. In some embodiments, the barrier layer is not formed. The seed layer 160 is made of a conductive material, such as metal (e.g., copper, aluminum, gold, silver, tungsten, titanium, cobalt, or ruthenium) or alloys thereof, in accordance with some embodiments. The seed layer 160 is formed using a deposition process, such as a physical vapor deposition (PVD) process, a chemical vapor deposition (CVD) process, or an atomic layer deposition (ALD) process, in accordance with some embodiments.

Figure 1C:
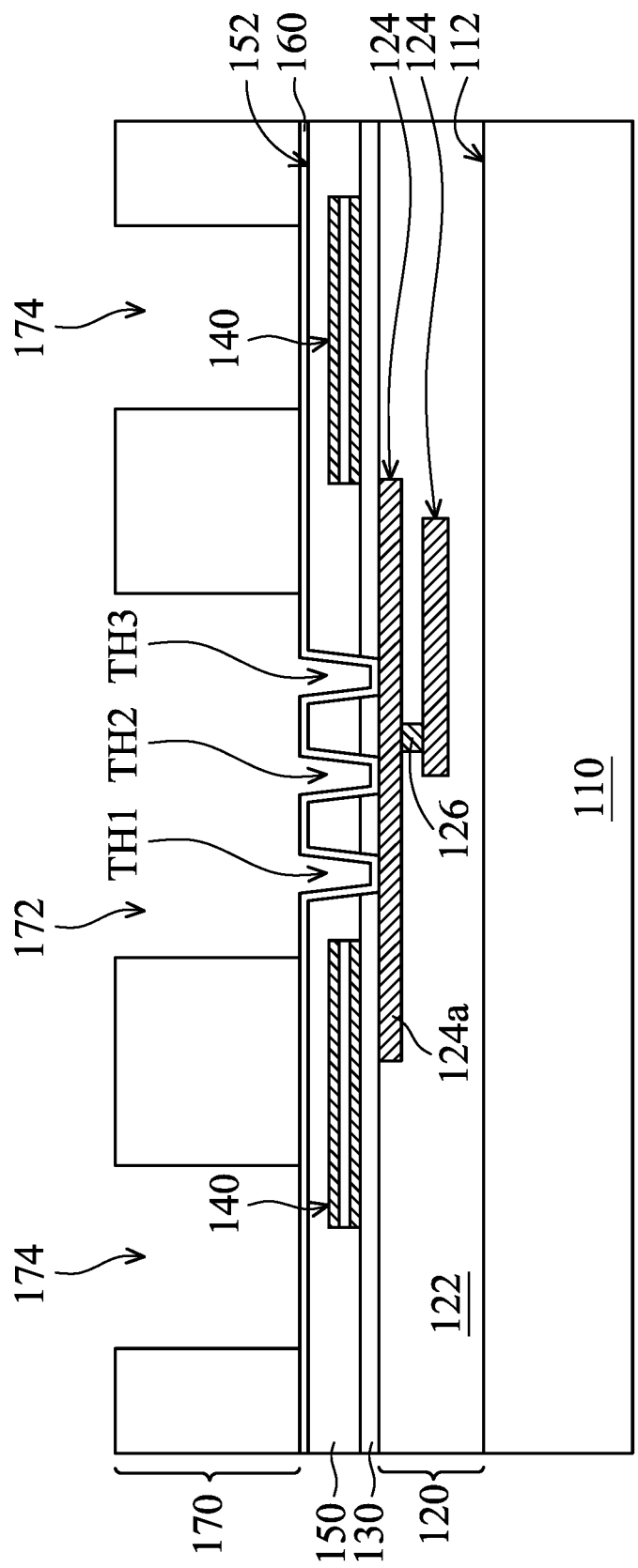

As shown in FIG. 1C, a mask layer 170 is formed over the seed layer 160, in accordance with some embodiments. The mask layer 170 has an opening 172 and trenches 174 exposing portions of the seed layer 160, in accordance with some embodiments. The opening 172 exposes a portion of the seed layer 160 in the through holes TH1, TH2, and TH3 and a portion of the seed layer 160 over a top surface 152 of the passivation layer 150, in accordance with some embodiments. The mask layer 170 is made of a polymer material, such as a photoresist material, in accordance with some embodiments.

After the mask layer 170 is formed, a descum process is performed over the seed layer 160 exposed by the opening 172 and the trenches 174 to remove the residues over the seed layer 160, in accordance with some embodiments. The descum process includes an etching process such as a plasma etching process, in accordance with some embodiments.

Figure 1D:
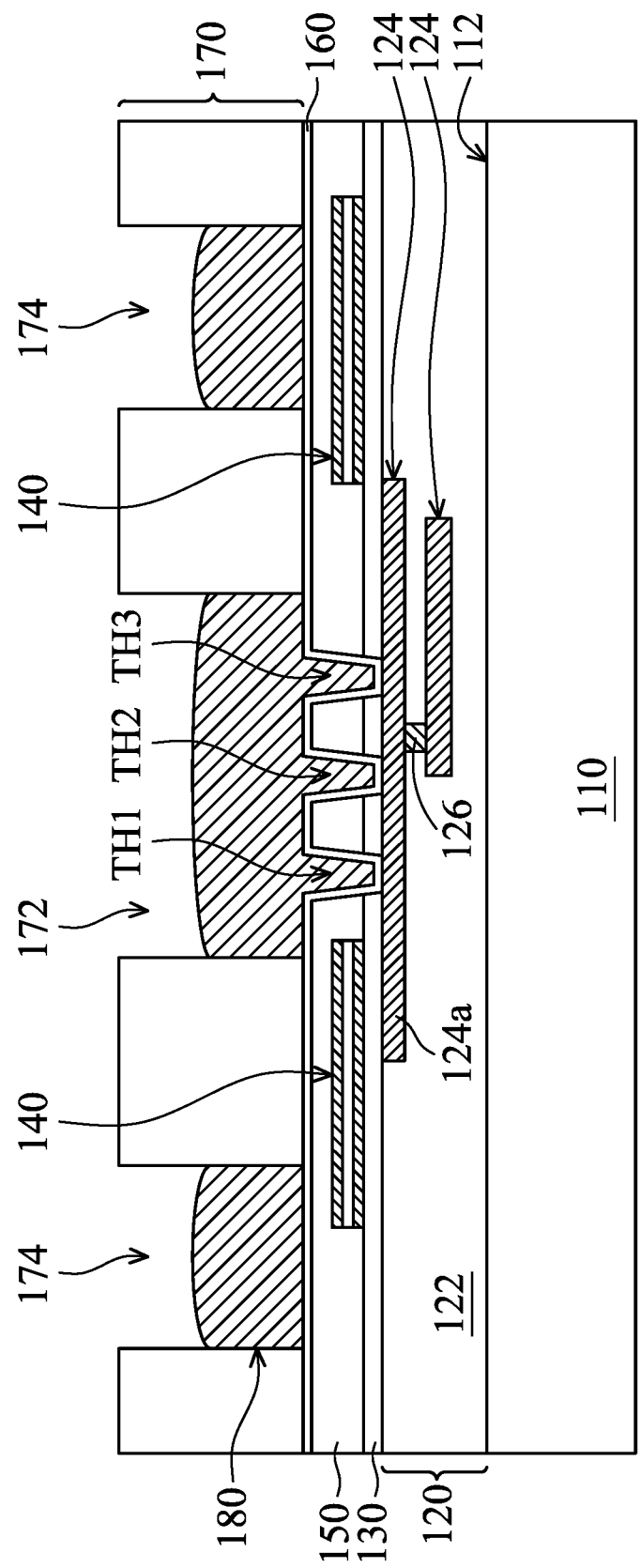

As shown in FIG. 1D, a conductive layer 180 is formed over the seed layer 160 exposed by the opening 172 and the trenches 174, in accordance with some embodiments. The conductive layer 180 is made of a conductive material, such as metal (e.g., copper) or alloys thereof, in accordance with some embodiments. The conductive layer 180 is formed by a plating process, such as an electroplating process, in accordance with some embodiments.

Figure 1E:
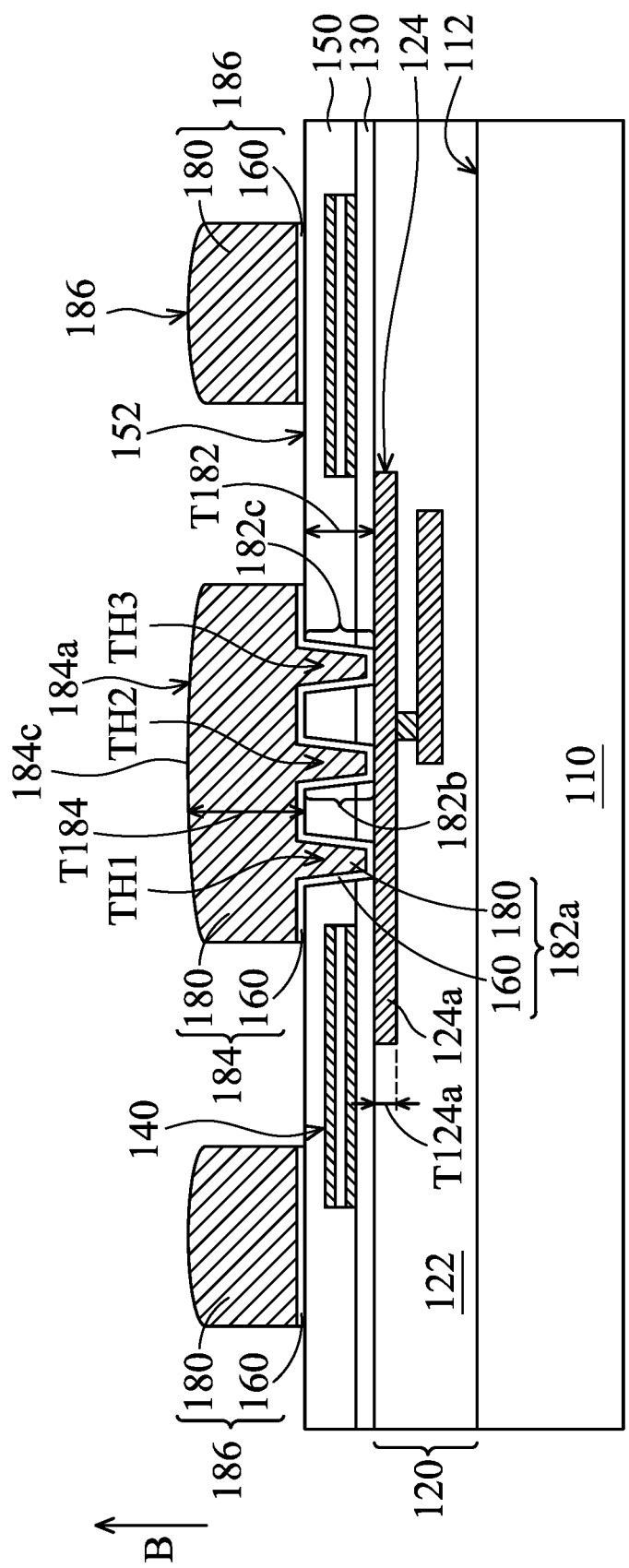

As shown in FIG. 1E, the mask layer 170 is removed, in accordance with some embodiments. As shown in FIG. 1E, the seed layer 160 originally under the mask layer 170 is removed, in accordance with some embodiments. The removal process includes an etching process such as a wet etching process, in accordance with some embodiments. The barrier layer (not shown), which is not covered by the conductive layer 180, is removed, in accordance with some embodiments. The removal process includes an etching process such as a dry etching process or a wet etching process, in accordance with some embodiments.

As shown in FIGS. 1D and 1E, the conductive layer 180, originally in the opening 172, and the seed layer 160 thereunder together form a conductive pad 184, in accordance with some embodiments. The conductive layer 180, originally in the trenches 174, and the seed layer 160 thereunder together form conductive lines 186, in accordance with some embodiments. The conductive layer 180 in the through holes TH1, TH2, and TH3 and the seed layer 160 thereunder together form conductive via structures 182a, 182b, and 182c, in accordance with some embodiments.

The conductive pad 184 is thicker than the conductive line 124a, in accordance with some embodiments. That is, a thickness T184 of the conductive pad 184 is greater than a thickness T124a of the conductive line 124a, in accordance with some embodiments. The conductive pad 184 is thicker than the conductive via structure 182a, 182b, or 182c, in accordance with some embodiments. That is, the thickness T184 of the conductive pad 184 is greater than a thickness T182 of the conductive via structure 182a, 182b, or 182c, in accordance with some embodiments. The thickness T184 ranges from about 2 μm to about 6 μm, in accordance with some embodiments. The thickness T184 ranges from about 2 μm to about 7 μm, in accordance with some embodiments. The thickness T182 ranges from about 0.1 μm to about 1 μm, in accordance with some embodiments. The thickness T182 ranges from about 0.2 μm to about 0.6 μm, in accordance with some embodiments. In some embodiments, the thickness T184 is greater than the sum of the thicknesses T182 and T124a of the conductive via structure 182a, 182b, or 182c and the conductive line 124a.

The conductive pad 184 has a top surface 184a, in accordance with some embodiments. Since the electroplating process for forming the conductive layer 180 of the conductive pad 184 has good hole-filling ability, the top surface 184a does not has small recesses respectively over the through holes TH1, TH2, and TH3 (or the conductive via structures 182a, 182b, and 182c), in accordance with some embodiments. Since stress tends to concentrate around the small recesses, the electroplating process, which has good hole-filling ability, prevents stress from concentrating over the conductive via structures 182a, 182b, and 182c, in accordance with some embodiments. That is, the roughness of the top surface 184a is reduced by the electroplating process, in accordance with some embodiments.

In some embodiments, the top surface 184a is a convex top surface (or a dome surface). The conductive via structures 182a, 182b and 182c are under the top surface 184a (i.e., the convex top surface), in accordance with some embodiments.

The conductive via structures 182a, 182b and 182c pass through the passivation layers 130 and 150, in accordance with some embodiments. The conductive via structures 182a, 182b and 182c are directly connected between the conductive pad 184 and the conductive line 124a thereunder, in accordance with some embodiments.

The conductive via structure 182a or 182c and a center portion 184c of the conductive pad 184 are misaligned in a direction B perpendicular to the top surface 112 of the substrate 110, in accordance with some embodiments. The center portion 184c is between the conductive via structures 182a and 182c, in accordance with some embodiments.

The conductive via structure 182b and the center portion 184c are aligned with each other in the direction B, in accordance with some embodiments. That is, the conductive via structure 182b is under the center portion 184c, in accordance with some embodiments. The conductive via structure 182b is connected between the conductive line 124a and the center portion 184c, in accordance with some embodiments. In some embodiments, the conductive via structures 182a, 182b, and 182c have a trapezoid shape.

Figure 1F:
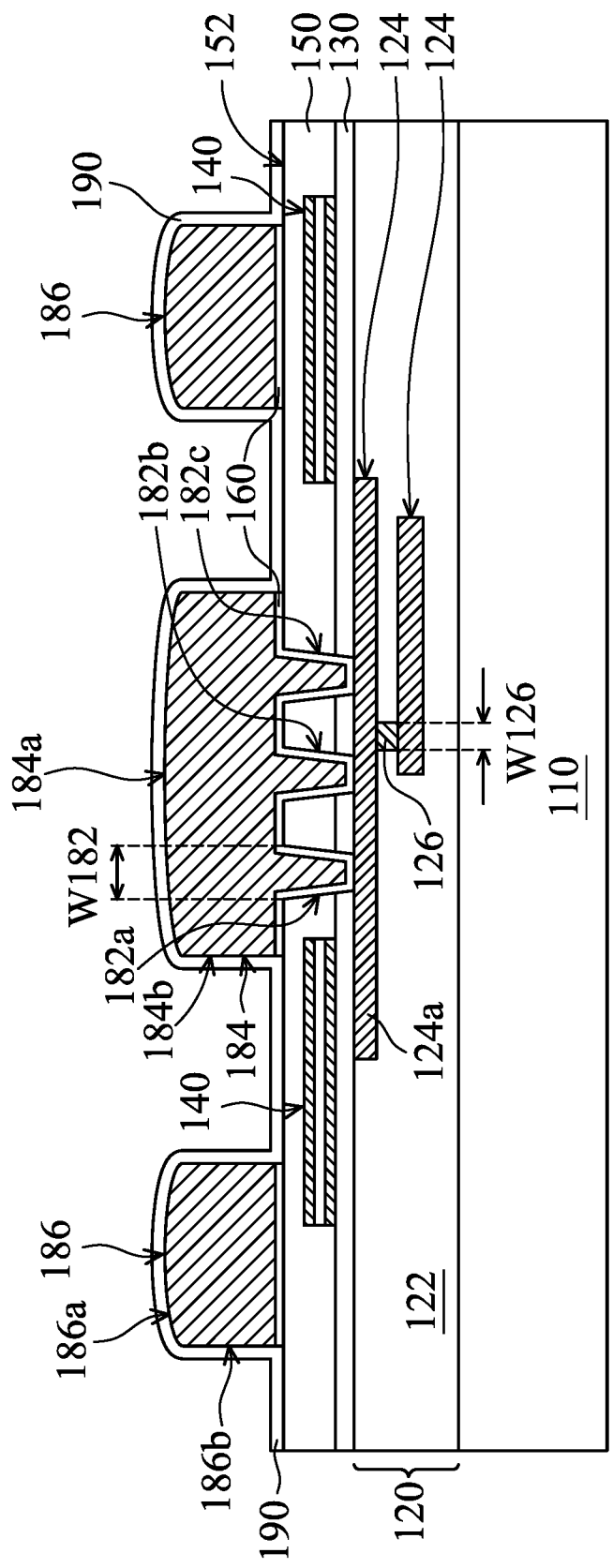

As shown in FIG. 1F, a passivation layer 190 is conformally formed over the passivation layer 150, the conductive pad 184, and the conductive lines 186, in accordance with some embodiments. The passivation layer 190 conformally covers the top surface 184a and sidewalls 184b of the conductive pad 184, a top surface 186a and sidewalls 186b of each conductive line 186, and the top surface 152 of the passivation layer 150, in accordance with some embodiments.

The passivation layer 190 is made of a dielectric material, such as nitrides (e.g., silicon nitride or silicon oxynitride), in accordance with some embodiments. The passivation layer 190 is formed using a deposition process (e.g., a chemical vapor deposition process, a physical vapor deposition process, or an atomic layer deposition process), in accordance with some embodiments. In some embodiments, a width W182 of the conductive via structure 182a, 182b, or 182c is greater than a width W126 of the conductive via 126.

Figure 1G:
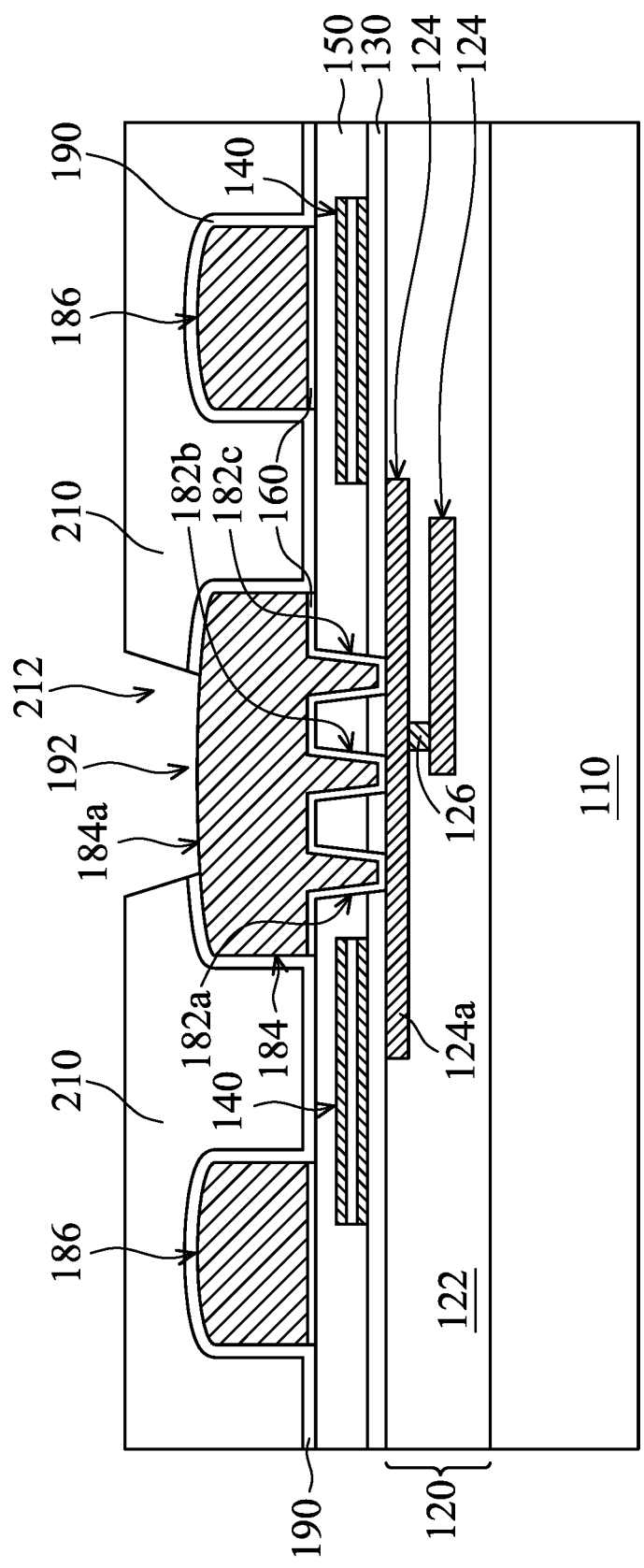

As shown in FIG. 1G, a mask layer 210 is formed over the passivation layer 190, in accordance with some embodiments. The mask layer 210 has an opening 212 exposing a portion of the passivation layer 190 over the conductive pad 184, in accordance with some embodiments. The mask layer 210 is made of a polymer material, such as a photoresist material, in accordance with some embodiments.

As shown in FIG. 1G, the passivation layer 190 exposed by the opening 212 is removed to form an opening 192 in the passivation layer 190, in accordance with some embodiments. The removal process includes an etching process such as a dry etching process or a wet etching process, in accordance with some embodiments.

Figure 1H:
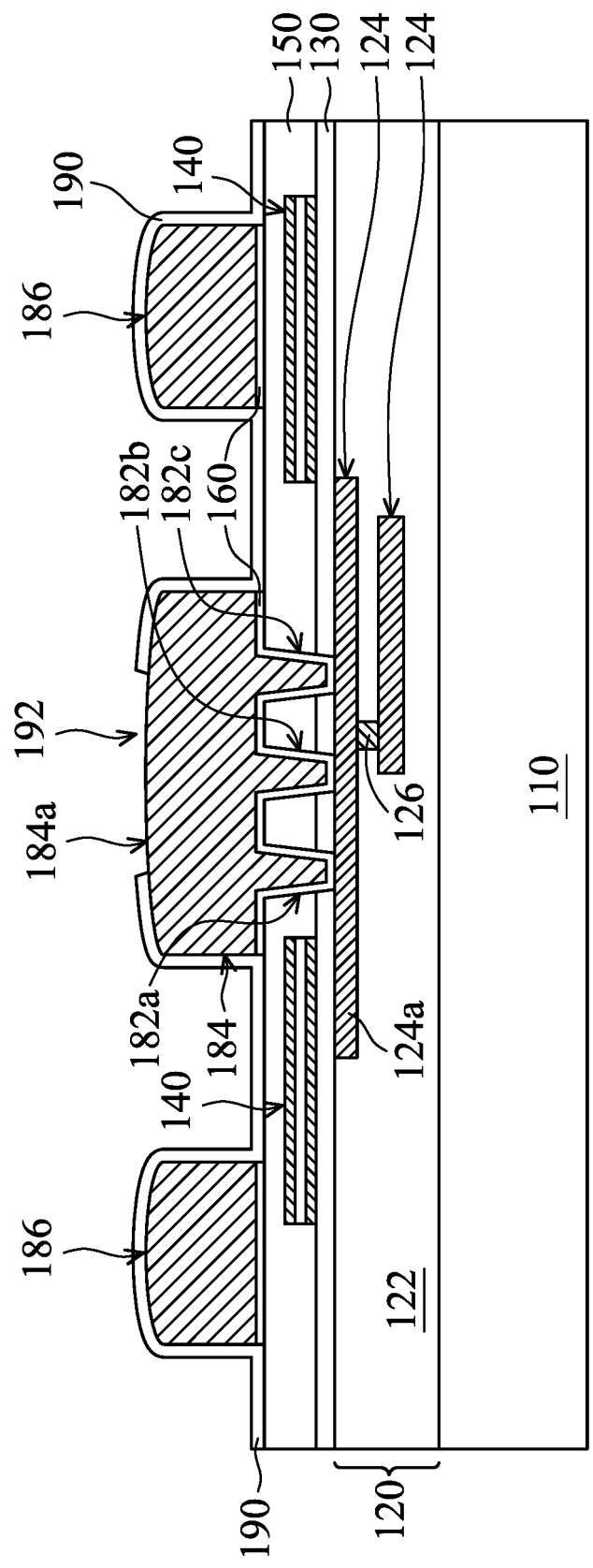

As shown in FIG. 1H, the mask layer 210 is removed, in accordance with some embodiments. The passivation layer 190 overlaps the conductive via structures 182a and 182c, in accordance with some embodiments. The conductive via structure 182b is under the opening 192 of the passivation layer 190, in accordance with some embodiments.

Figure 1I:
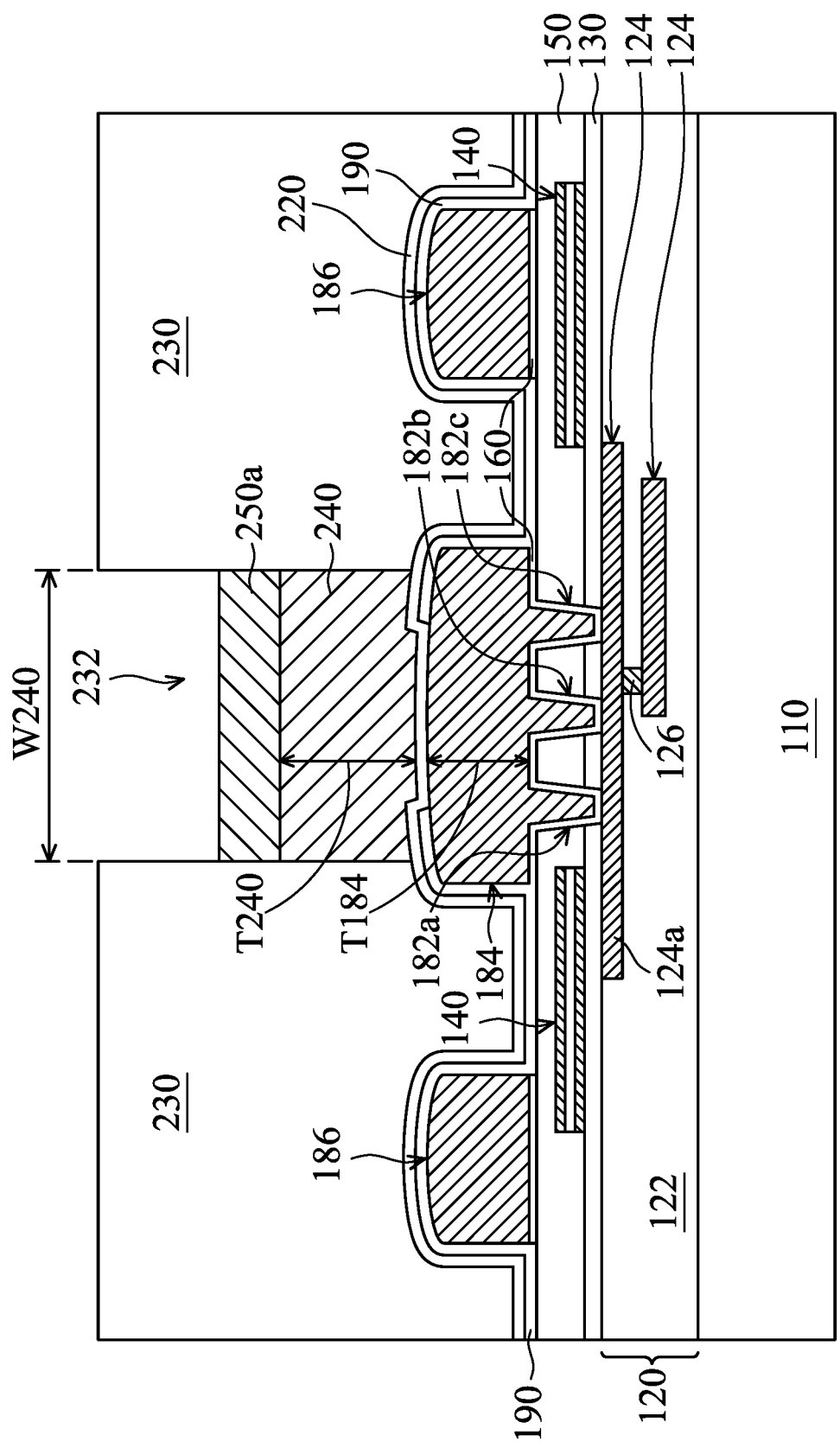

As shown in FIG. 1I, a seed layer 220 is conformally formed over the passivation layer 190 and the conductive pad 184, in accordance with some embodiments. The seed layer 220 is in direct contact with the passivation layer 190 and the conductive pad 184, in accordance with some embodiments. The seed layer 220 is made of a conductive material, such as metal (e.g., copper, aluminum, gold, silver, tungsten, titanium, cobalt, or ruthenium) or alloys thereof, in accordance with some embodiments. The seed layer 220 is formed using a deposition process, such as a physical vapor deposition (PVD) process, a chemical vapor deposition (CVD) process, or an atomic layer deposition (ALD) process, in accordance with some embodiments. The conductive pad 184 has a thickness T184 ranging from about 2 μm to about 10 μm, in accordance with some embodiments.

As shown in FIG. 1I, a mask layer 230 is formed over the seed layer 220, in accordance with some embodiments. The mask layer 230 has an opening 232 exposing a portion of the seed layer 220 over the conductive pad 184, in accordance with some embodiments. The mask layer 230 is made of a polymer material, such as a photoresist material, in accordance with some embodiments.

As shown in FIG. 1I, a conductive layer 240 is formed over the seed layer 220 exposed by the opening 232, in accordance with some embodiments. The conductive layer 240 is made of a conductive material, such as metal (e.g., titanium, copper, nickel, or aluminum) or alloys thereof, in accordance with some embodiments. The conductive layer 240 is formed using a plating process, such as an electroplating process, in accordance with some embodiments.

The conductive layer 240 has a thickness T240 ranging from about 5 μm to about 17 μm, in accordance with some embodiments. The conductive layer 240 has a width W240 ranging from about 5 μm to about 22 μm, in accordance with some embodiments.

As shown in FIG. 1I, a solder layer 250a is formed over the conductive layer 240, in accordance with some embodiments. The solder layer 250a is made of a conductive material, such as metal (e.g., tin or the like) or alloys thereof, in accordance with some embodiments. The solder layer 250a is formed using a plating process, such as an electroplating process, in accordance with some embodiments. In some other embodiments, the solder layer 250a is formed using a ball mount process.

Figure 1J:
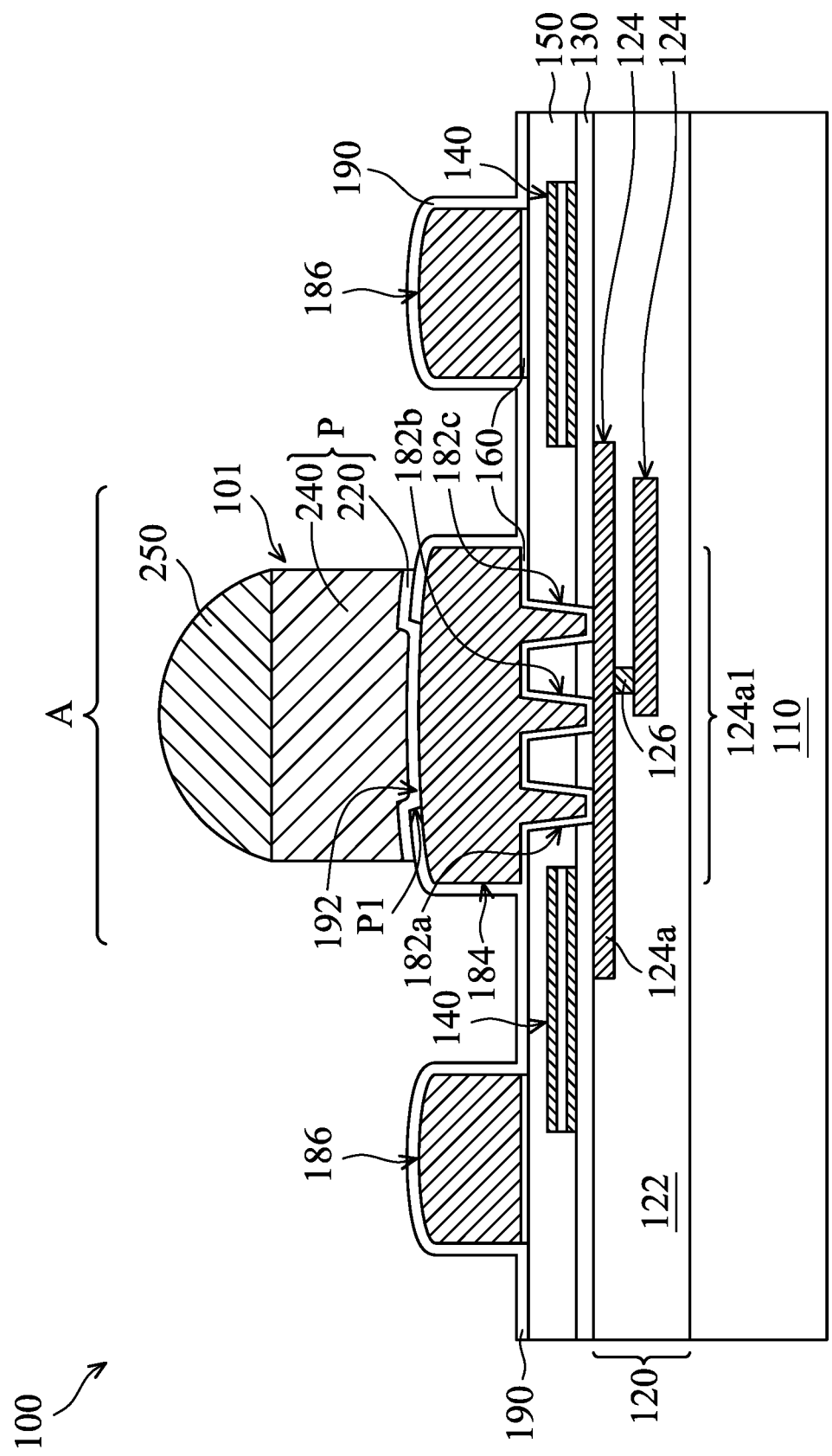
Figures 1, 1J:
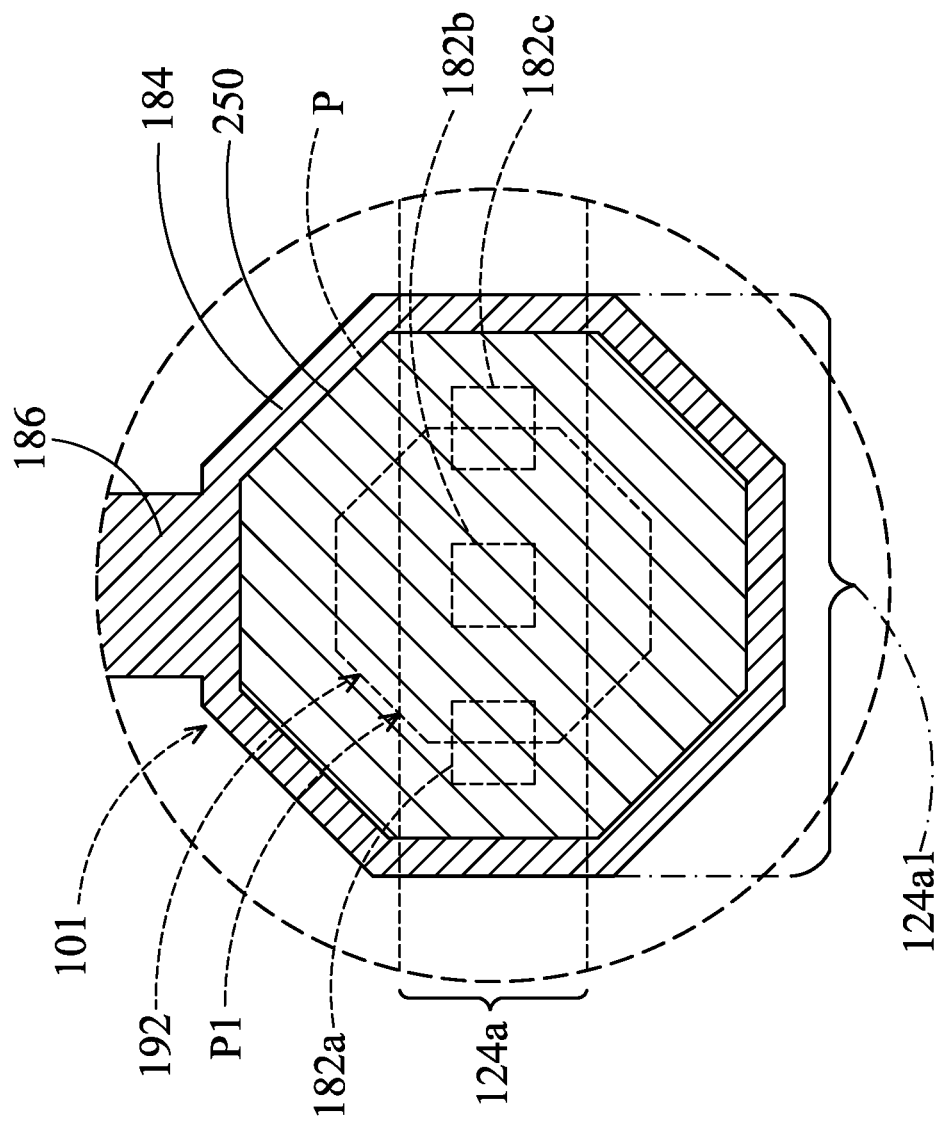

FIG. 1J-1 is a top view of a region A of the chip structure of FIG. 1J, in accordance with some embodiments. As shown in FIGS. 1J and 1J-1, the mask layer 230 is removed, in accordance with some embodiments. As shown in FIGS. 1J and 1J-1, the seed layer 220 originally under the mask layer 230 is removed, in accordance with some embodiments. The removal process includes an etching process such as a wet etching process, in accordance with some embodiments.

As shown in FIGS. 1I, 1J, and 1J-1, a reflow process is performed over the solder layer 250a to form a solder bump 250, in accordance with some embodiments. In this step, a chip structure 100 is substantially formed, in accordance with some embodiments.

The conductive layer 240 and the seed layer 220 remaining under the conductive layer 240 together form a conductive pillar P, in accordance with some embodiments. The conductive pillar P is over the passivation layer 190 and fills the opening 192, in accordance with some embodiments. The conductive pillar P has a protruding bottom portion P1 passing through the passivation layer 190, in accordance with some embodiments. The conductive via structures 182a, 182b, and 182c are under the protruding bottom portion P1, in accordance with some embodiments.

For the sake of simplicity, FIG. 1J-1 omits depicting the passivation layer 190, in accordance with some embodiments. Similarly, FIGS. 5B, 6B, 7B, 8B, 9-22, 23C and 25 omit depicting the passivation layer 190, in accordance with some embodiments.

As shown in FIG. 1J-1, the conductive pad 184 is wider than the conductive line 124a, in accordance with some embodiments. As shown in FIG. 1J-1, the conductive via structures 182a, 182b, and 182c are arranged along the portion 124a1 of the conductive line 124a under the conductive pad 184, in accordance with some embodiments. As shown in FIG. 1J-1, the conductive via structures 182a, 182b, and 182c have a square shape, in accordance with some embodiments.

The conductive via structures 182a, 182b, and 182c, the conductive pad 184, the conductive pillar P, and the solder bump 250 together form a conductive connector 101, in accordance with some embodiments. That is, FIG. 1J-1 is a top view of the conductive connector 101 and the conductive line 124a of the chip structure 100, in accordance with some embodiments.

The conductive via structures 182a, 182b, and 182c are able to share the bonding stress from the conductive pillar P during a subsequent bonding process for bonding the conductive pillar P to a substrate (not shown) through the solder bump 250, in accordance with some embodiments. Therefore, the conductive via structures 182a, 182b, and 182c are able to prevent the bonding stress from concentrating in only one conductive via structure, which improves the reliability of the chip structure 100, in accordance with some embodiments.

In a portion of the chip structure 100 under the conductive pad 184, the conductive via structures 182a, 182b, and 182c may provide more support force than only one conductive via structure, and therefore the conductive via structures 182a, 182b, and 182c may reduce the bonding stress applied to the passivation layers 130 and 150 under the conductive pad 184, which prevents the passivation layers 130 and 150 from cracking and/or delamination.

Similarly, the conductive via structures 182a, 182b, and 182c are also able to reduce the bonding stress applied to the MIM capacitor 140 under the conductive pad 184, which prevents the MIM capacitor 140 from cracking, in accordance with some embodiments.

If one of the conductive via structures 182a, 182b, and 182c is broken, the others of the conductive via structures 182a, 182b, and 182c may still connected between the conductive pad 184 and the conductive line 124a. Therefore, the multiple conductive via structures 182a, 182b, and 182c may improve the reliability of the electrical connection between the conductive pad 184 and the conductive line 124a.

The total connection area between the conductive via structures 182a, 182b, and 182c and the conductive pad 184 (or the conductive line 124a) is greater than the connection area between only one conductive via structure and the conductive pad 184 (or the conductive line 124a), in accordance with some embodiments. Therefore, the formation of the multiple conductive via structures 182a, 182b, and 182c reduces the resistance between the conductive pad 184 and the conductive line 124a, which improves the performance of the chip structure 100, in accordance with some embodiments.

Since the total connection area between the conductive pad 184 and the conductive via structures 182a, 182b, and 182c is greater than the connection area between the conductive pad 184 and only one conductive via structure, the formation of the multiple conductive via structures 182a, 182b, and 182c reduces the electromigration effect and increases the electromigration lifetime, which improves the reliability of the electrical connection between the conductive pad 184 and the conductive line 124a, in accordance with some embodiments.

Since the total connection area between the conductive pad 184 and the conductive via structures 182a, 182b, and 182c is greater than the connection area between the conductive pad 184 and only one conductive via structure, the conductive via structures 182a, 182b, and 182c are able to firmly secure the conductive pad 184 to the passivation layer 150, which improves the reliability of the chip structure 100, in accordance with some embodiments.

The material property of copper may reduce the stress migration and the electromigration effect, in accordance with some embodiments. Therefore, if the conductive pad 184 and the conductive via structures 182a, 182b, and 182c are made of copper, the stress migration and the electromigration effect are reduced, in accordance with some embodiments. The electromigration lifetime is increased and the reliability of the chip structure 100 is improved, in accordance with some embodiments.

Figure 2:
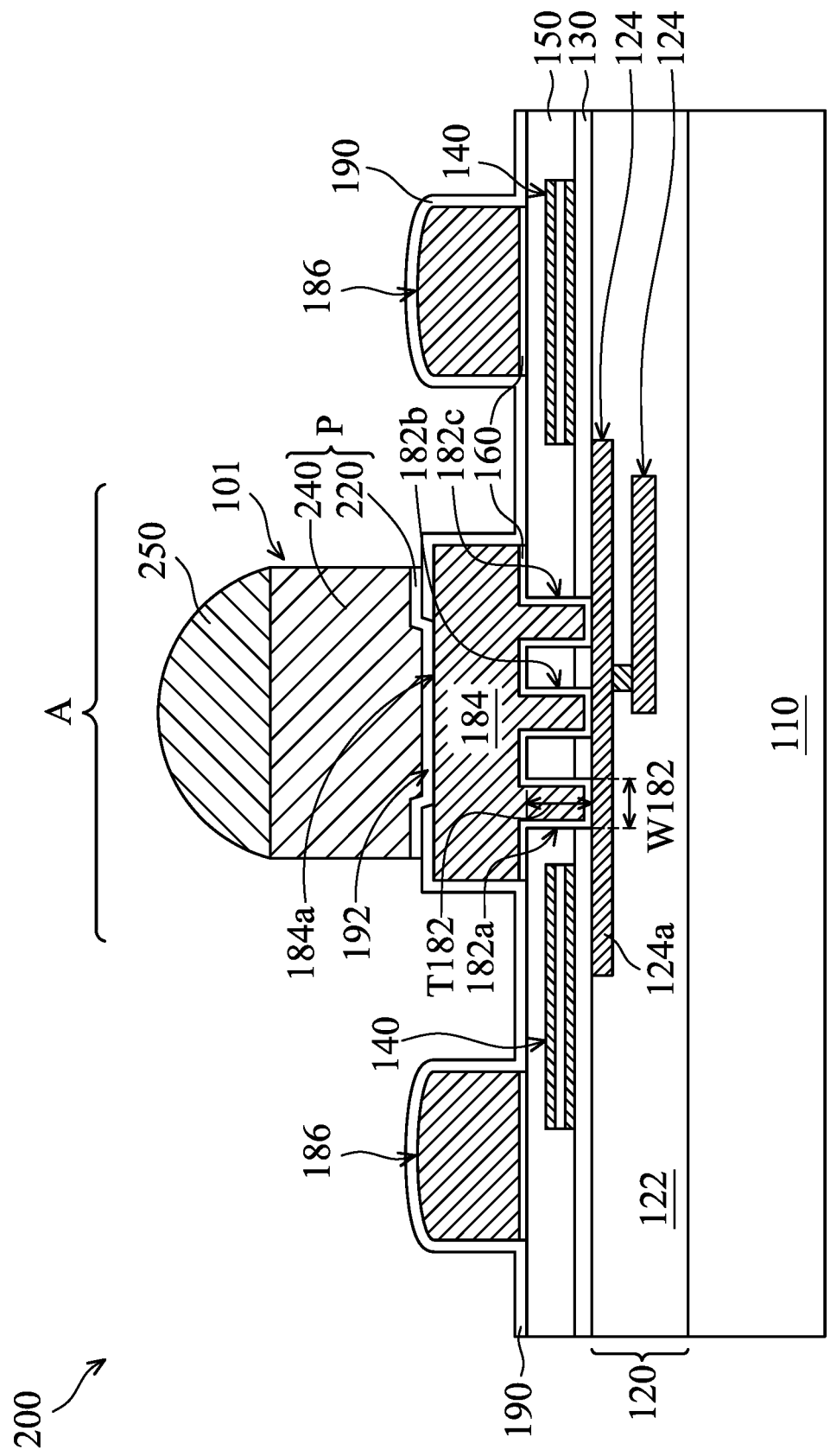
FIG. 2 is a cross-sectional view of a chip structure, in accordance with some embodiments.

FIG. 2 is a cross-sectional view of a chip structure 200, in accordance with some embodiments. As shown in FIG. 2, the chip structure 200 is similar to the chip structure 100 of FIG. 1J, except that the conductive via structures 182a, 182b, and 182c of the chip structure 200 have a rectangle shape, in accordance with some embodiments. That is, the thickness T182 of the conductive via structure 182a, 182b, or 182c is greater than the width W182 of the conductive via structure 182a, 182b, or 182c, in accordance with some embodiments. In some embodiments, the top surface 184a of the conductive pad 184 is a flat top surface.

Figure 3:
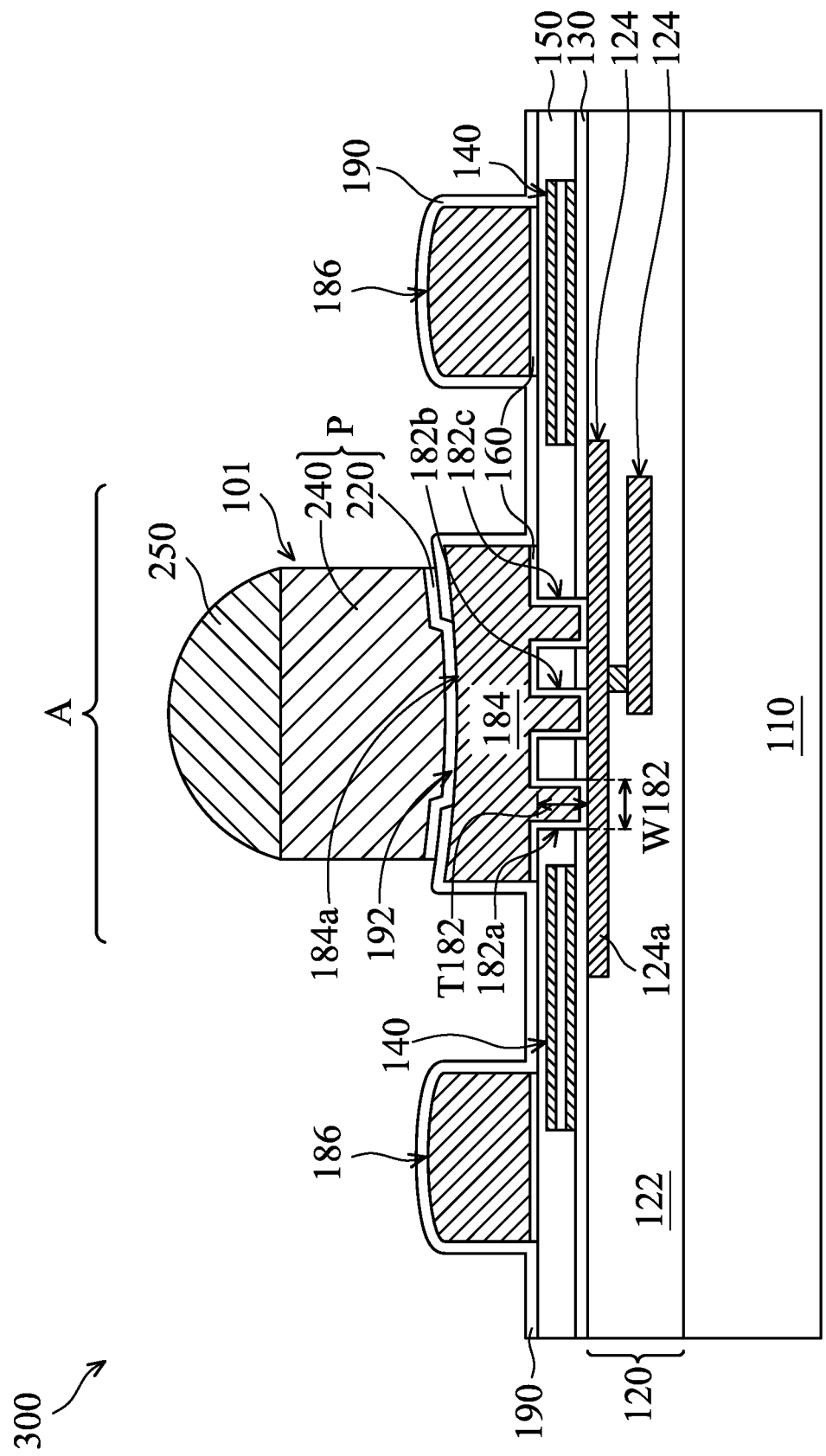
FIG. 3 is a cross-sectional view of a chip structure, in accordance with some embodiments.

FIG. 3 is a cross-sectional view of a chip structure 300, in accordance with some embodiments. As shown in FIG. 3, the chip structure 300 is similar to the chip structure 100 of FIG. 1J, except that the conductive via structures 182a, 182b, and 182c of the chip structure 300 have a square shape, in accordance with some embodiments. That is, the thickness T182 of the conductive via structure 182a, 182b, or 182c is substantially equal to the width W182 of the conductive via structure 182a, 182b, or 182c, in accordance with some embodiments.

In some embodiments, the top surface 184a of the conductive pad 184 is a concave top surface. The conductive via structures 182a, 182b, and 182c are under the top surface 184a (i.e., the concave top surface), in accordance with some embodiments. In some other embodiments (not shown), the conductive via structures 182a, 182b, and 182c have a polygonal shape such as a hexagonal shape, an octagonal shape, or the like.

Figure 4:
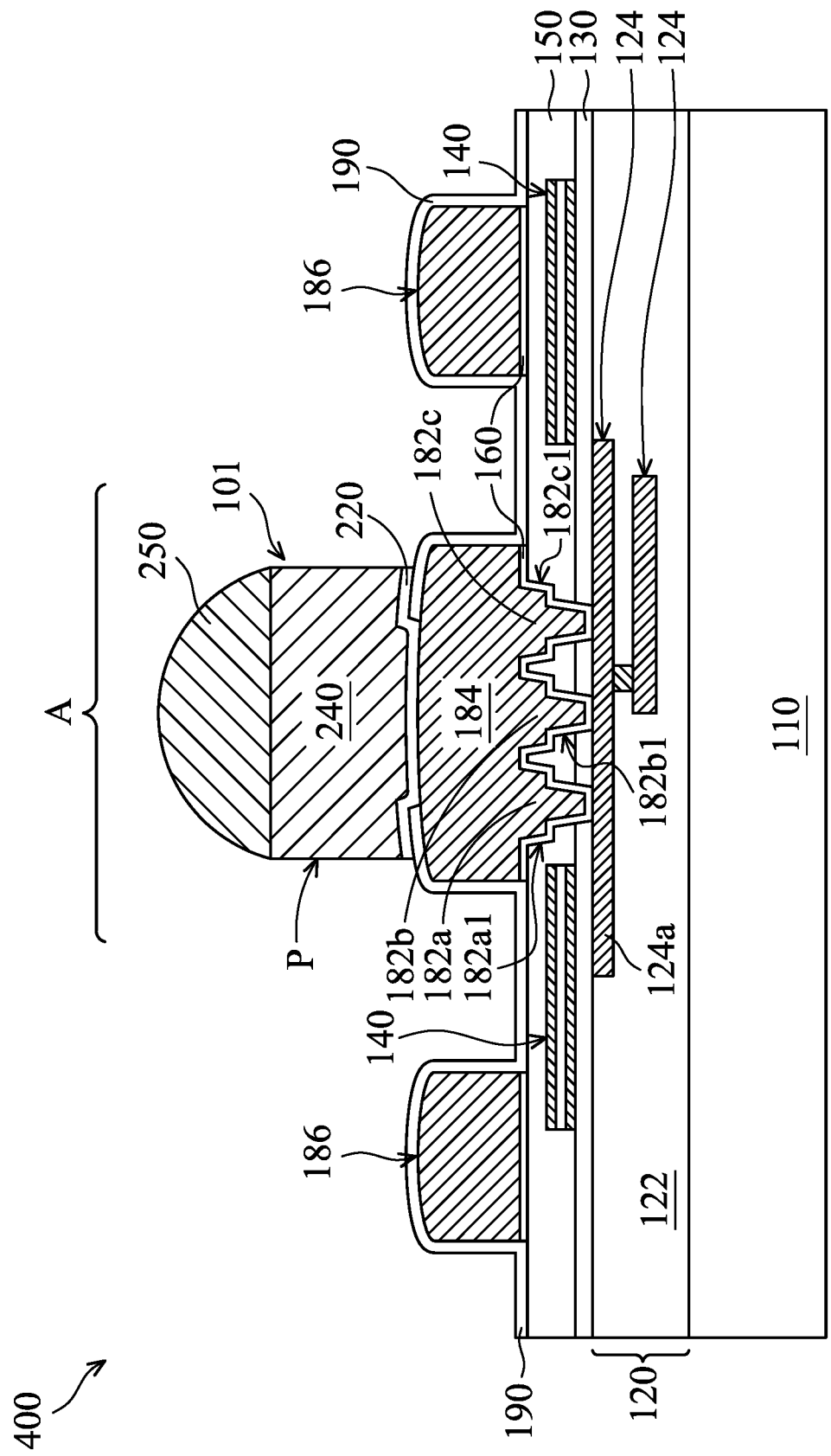
FIG. 4 is a cross-sectional view of a chip structure, in accordance with some embodiments.

FIG. 4 is a cross-sectional view of a chip structure 400, in accordance with some embodiments. As shown in FIG. 4, the chip structure 400 is similar to the chip structure 100 of FIG. 1J, except that the conductive via structures 182a, 182b, and 182c of the chip structure 400 have a ladder-like shape, in accordance with some embodiments. The conductive via structures 182a, 182b, and 182c respectively have ladder-shaped sidewalls 182a1, 182b1, and 182c1, in accordance with some embodiments.

Figure 5A:
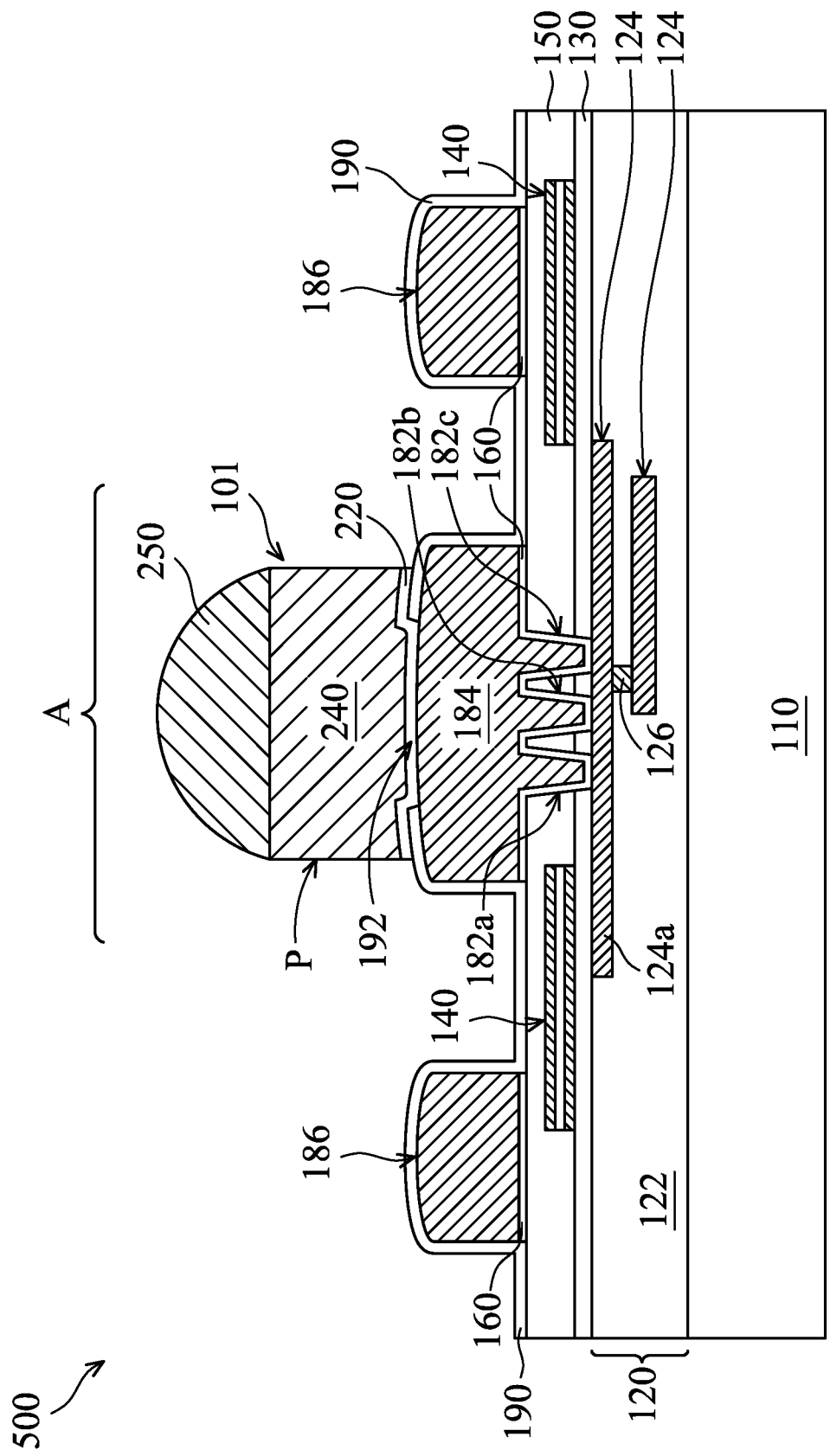
FIG. 5A is a cross-sectional view of a chip structure, in accordance with some embodiments.
Figure 5B:
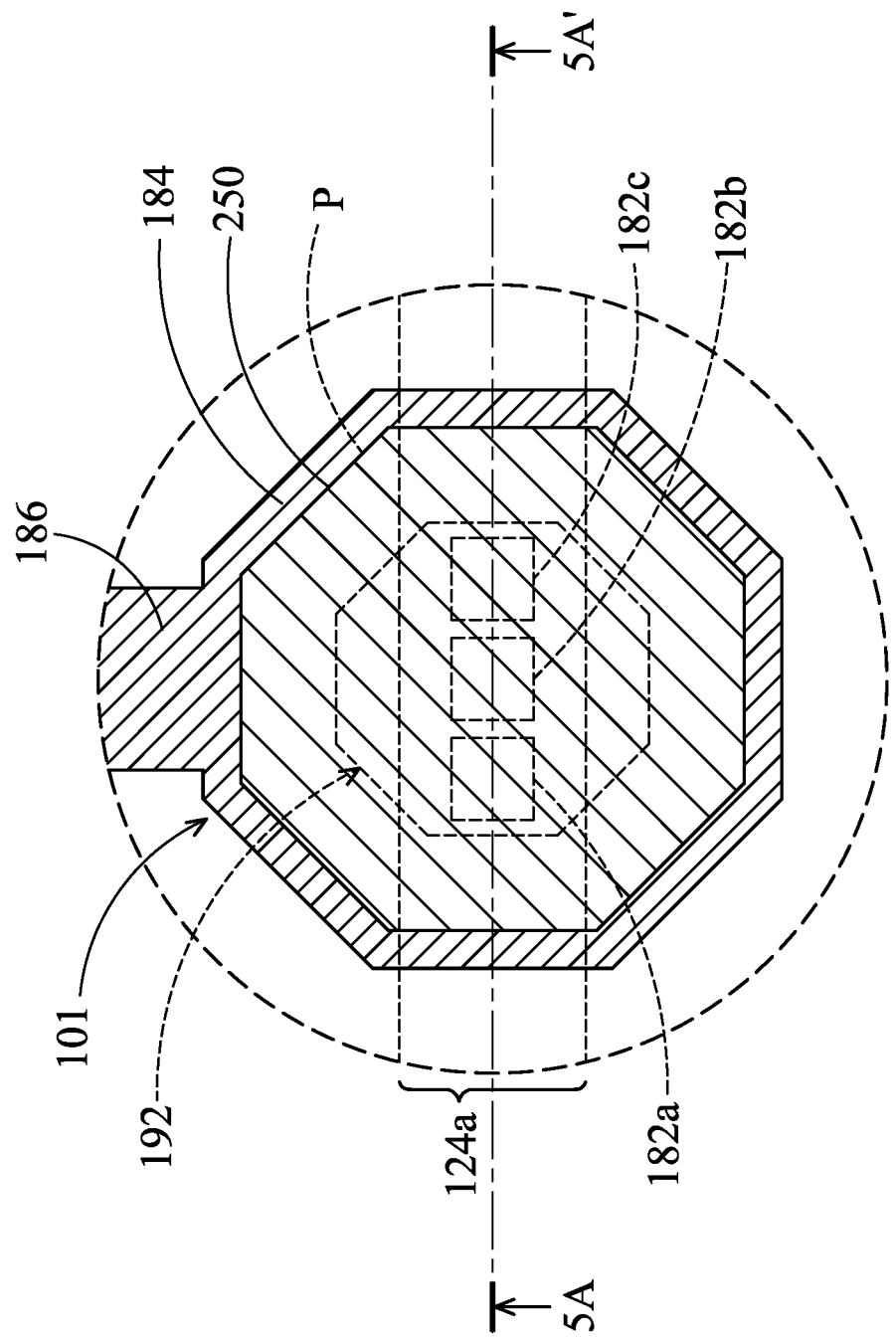
FIG. 5B is a top view of a region of the chip structure of FIG. 5A, in accordance with some embodiments.

FIG. 5A is a cross-sectional view of a chip structure 500, in accordance with some embodiments. FIG. 5B is a top view of a region A of the chip structure 500 of FIG. 5A, in accordance with some embodiments. The region A of FIG. 5A shows a cross-sectional view illustrating the chip structure 500 along a sectional line 5A-5A' in FIG. 5B, in accordance with some embodiments.

As shown in FIGS. 5A and 5B, the chip structure 500 is similar to the chip structure 100 of FIG. 1J, except that the entire conductive via structures 182a, 182b, and 182c of the chip structure 500 are under the opening 192 of the passivation layer 190, in accordance with some embodiments.

Figure 6A:
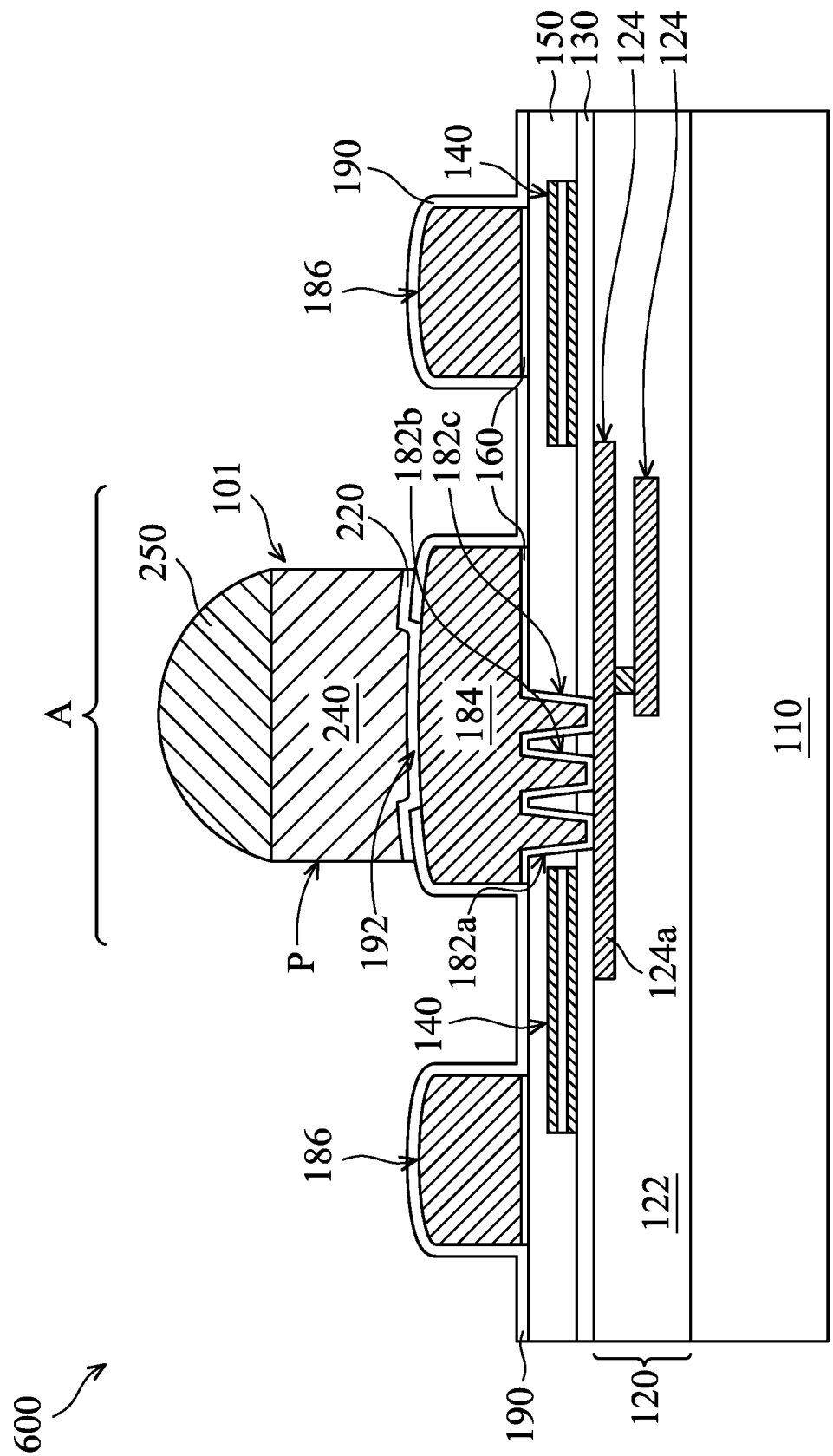
FIG. 6A is a cross-sectional view of a chip structure, in accordance with some embodiments.
Figure 6B:
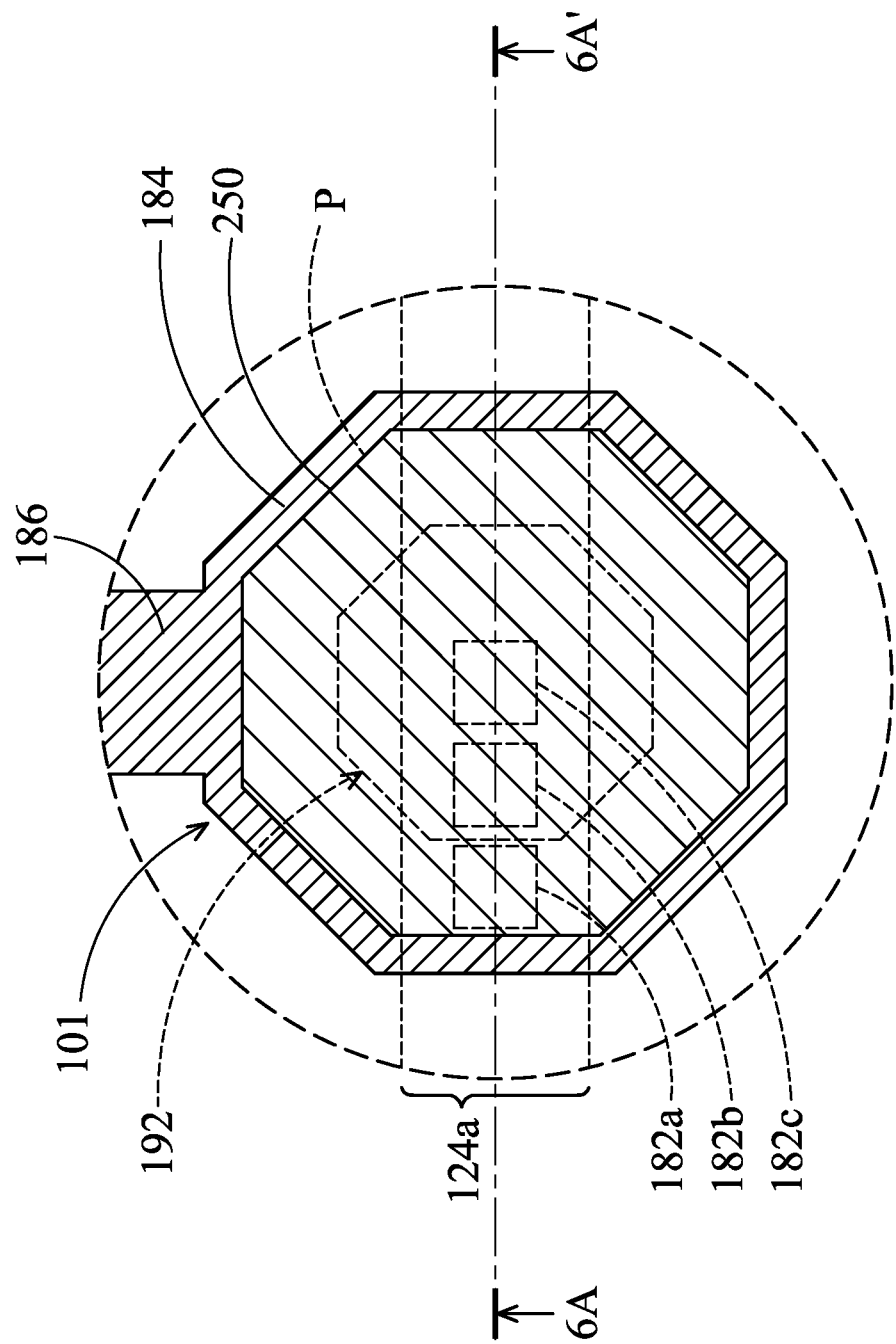
FIG. 6B is a top view of a region of the chip structure of FIG. 6A, in accordance with some embodiments.

FIG. 6A is a cross-sectional view of a chip structure 600, in accordance with some embodiments. FIG. 6B is a top view of a region A of the chip structure 600 of FIG. 6A, in accordance with some embodiments. The region A of FIG. 6A shows a cross-sectional view illustrating the chip structure 600 along a sectional line 6A-6A' in FIG. 6B, in accordance with some embodiments.

As shown in FIGS. 6A and 6B, the chip structure 600 is similar to the chip structure 100 of FIG. 1J, except that the entire conductive via structure 182a is under the passivation layer 190, and the entire conductive via structures 182b and 182c are under the opening 192 of the passivation layer 190, in accordance with some embodiments.

Figure 7A:
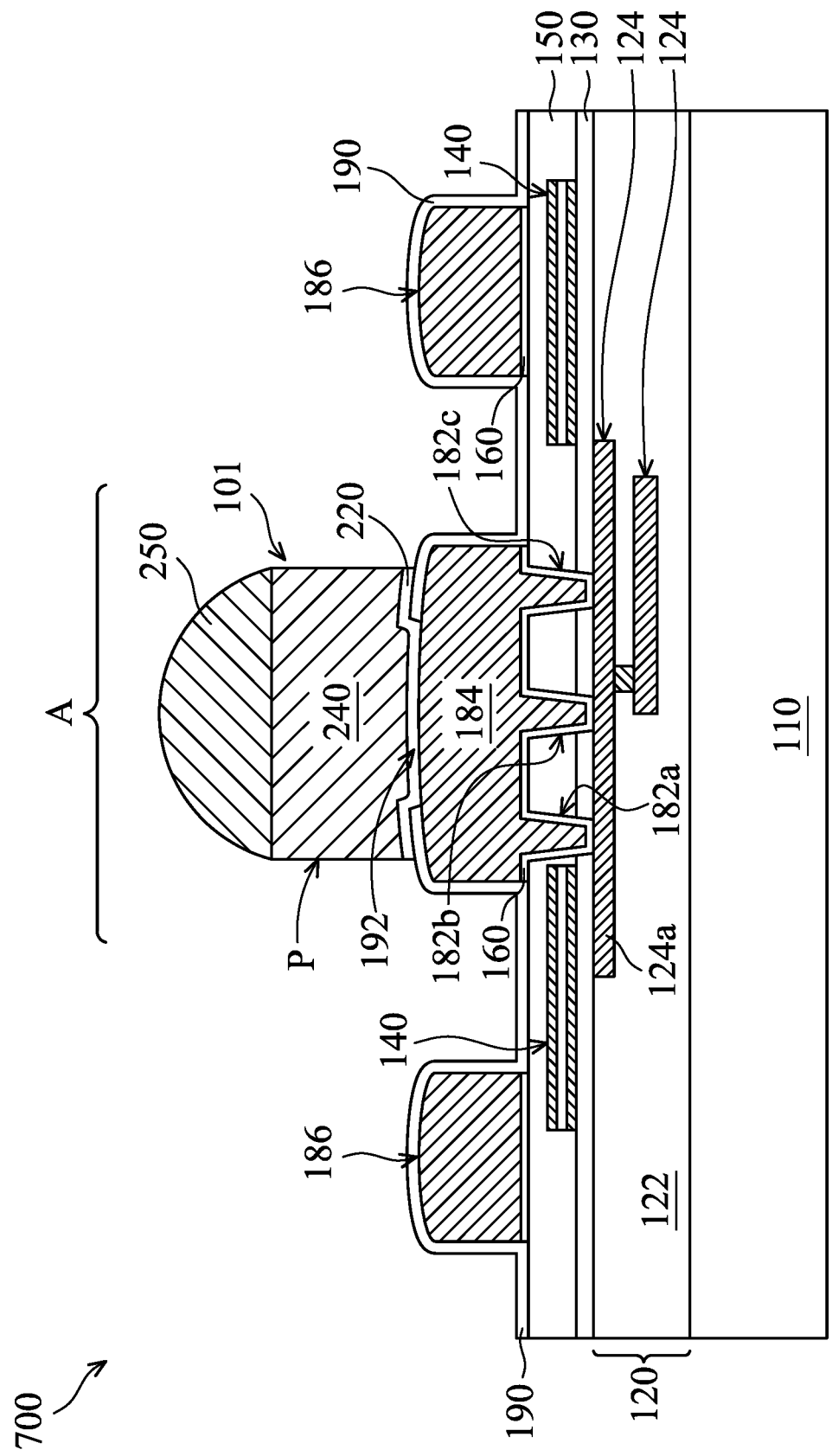
FIG. 7A is a cross-sectional view of a chip structure, in accordance with some embodiments.
Figure 7B:
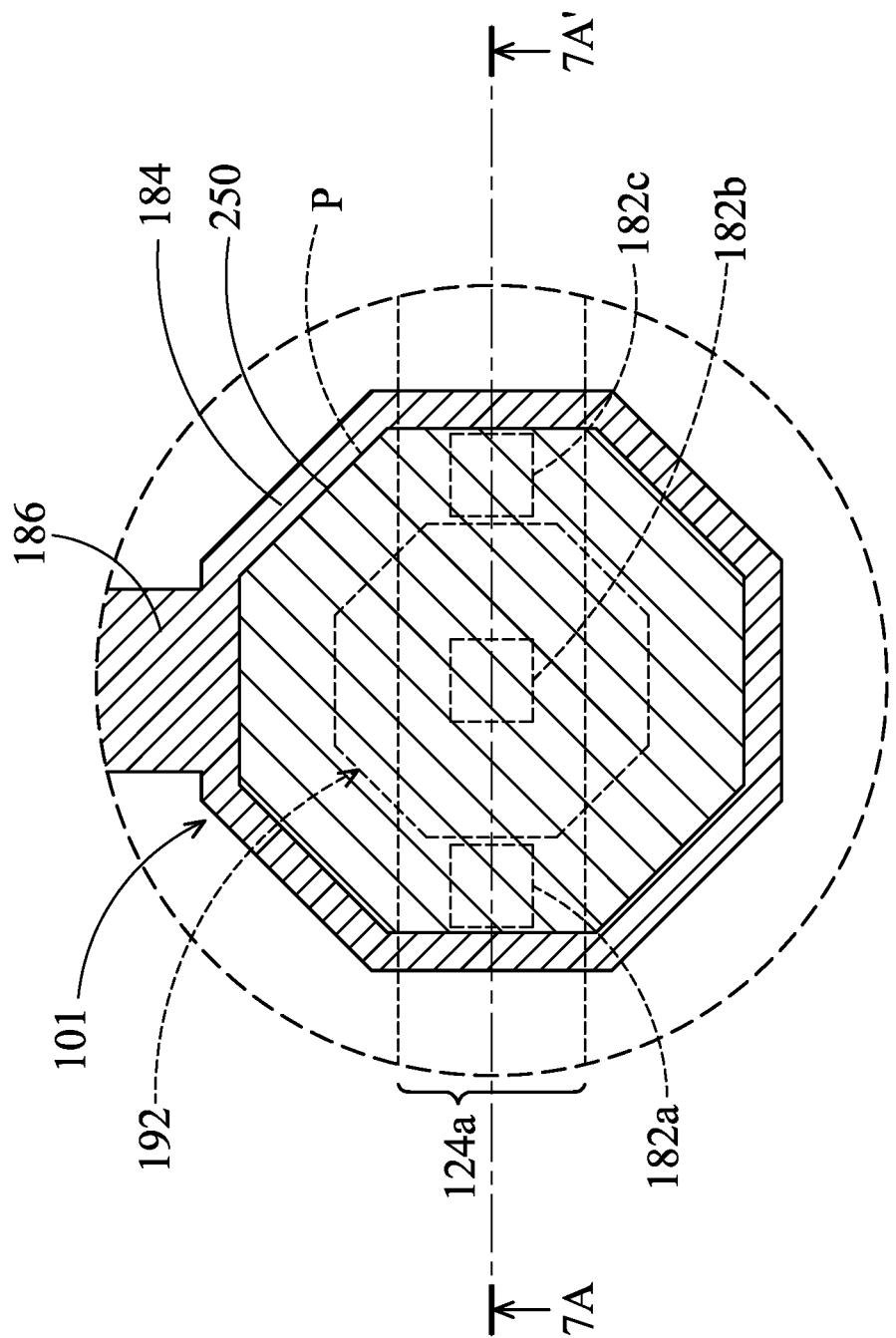
FIG. 7B is a top view of a region of the chip structure of FIG. 7A, in accordance with some embodiments.

FIG. 7A is a cross-sectional view of a chip structure 700, in accordance with some embodiments. FIG. 7B is a top view of a region A of the chip structure 700 of FIG. 7A, in accordance with some embodiments. The region A of FIG. 7A shows a cross-sectional view illustrating the chip structure 700 along a sectional line 7A-7A' in FIG. 7B, in accordance with some embodiments.

As shown in FIGS. 7A and 7B, the chip structure 700 is similar to the chip structure 100 of FIG. 1J, except that the conductive via structures 182a and 182c are entirely under the passivation layer 190, in accordance with some embodiments.

Figure 8A:
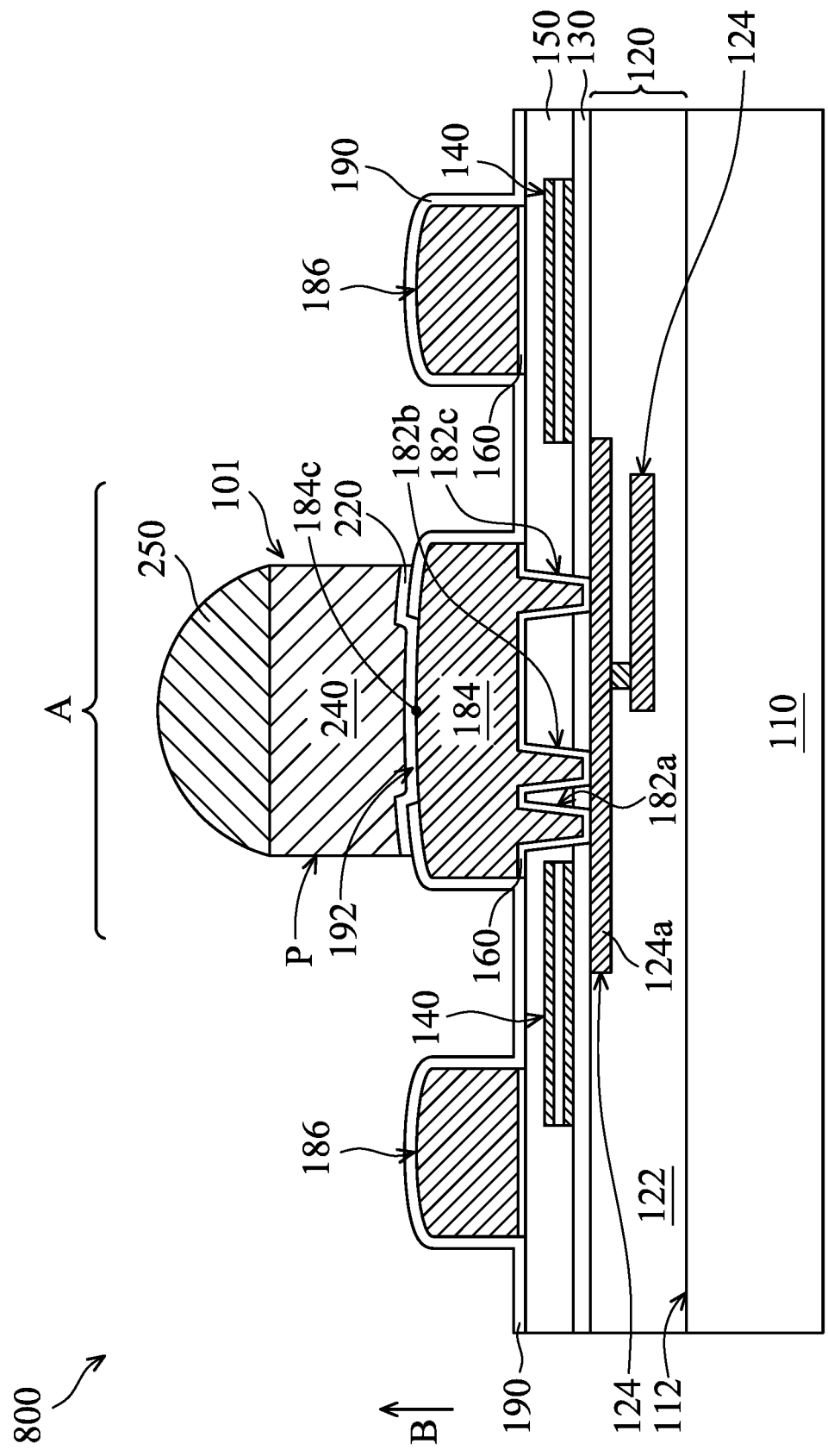
FIG. 8A is a cross-sectional view of a chip structure, in accordance with some embodiments.
Figure 8B:
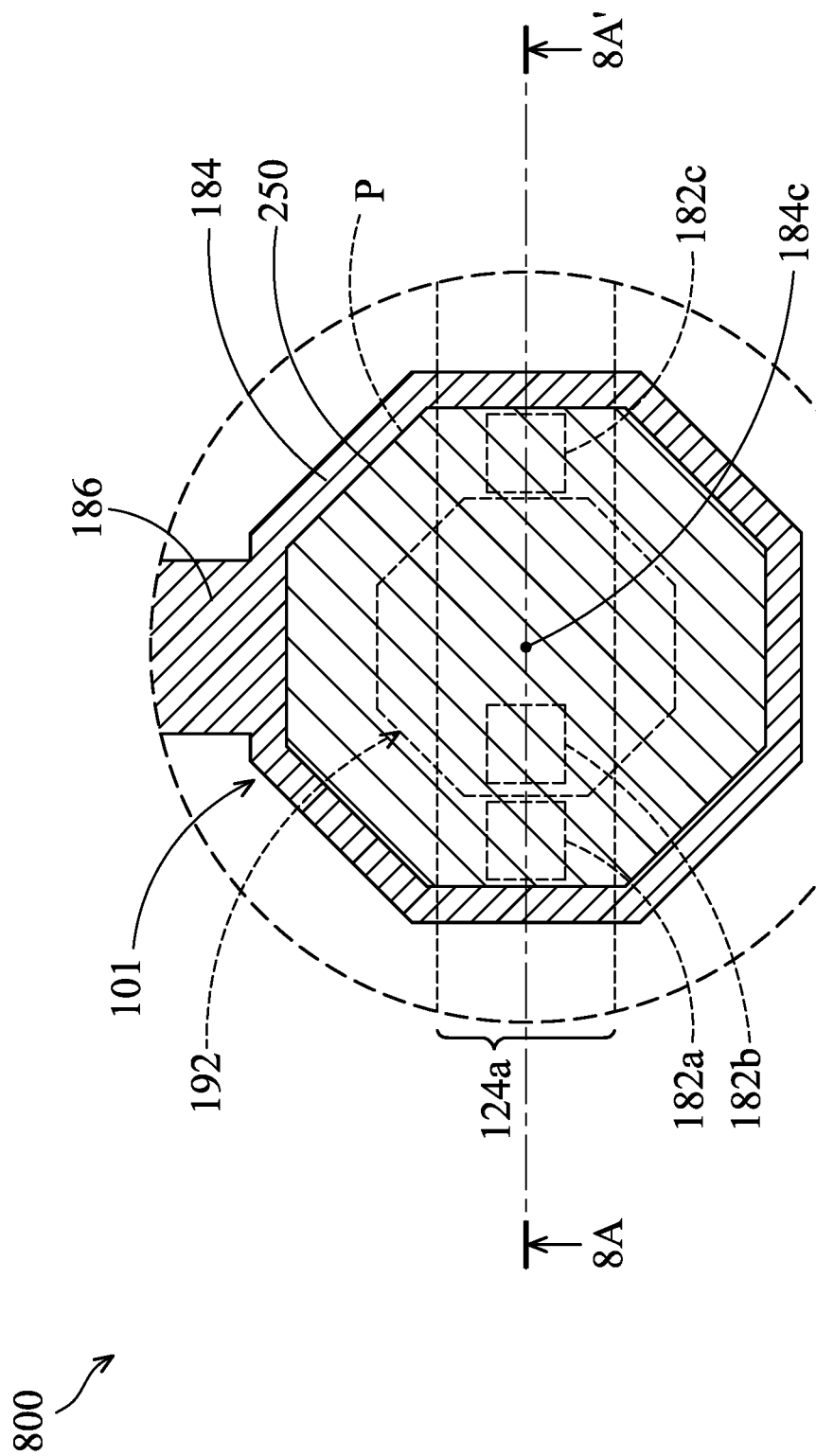
FIG. 8B is a top view of a region of the chip structure of FIG. 8A, in accordance with some embodiments.

FIG. 8A is a cross-sectional view of a chip structure 800, in accordance with some embodiments. FIG. 8B is a top view of a region A of the chip structure 800 of FIG. 8A, in accordance with some embodiments. The region A of FIG. 8A shows a cross-sectional view illustrating the chip structure 800 along a sectional line 8A-8A' in FIG. 8B, in accordance with some embodiments.

As shown in FIGS. 8A and 8B, the chip structure 800 is similar to the chip structure 700 of FIGS. 7A and 7B, except that the conductive via structure 182b and a center portion 184c of the conductive pad 184 are misaligned in a direction B perpendicular to the top surface 112 of the substrate 110, in accordance with some embodiments.

Figure 9:
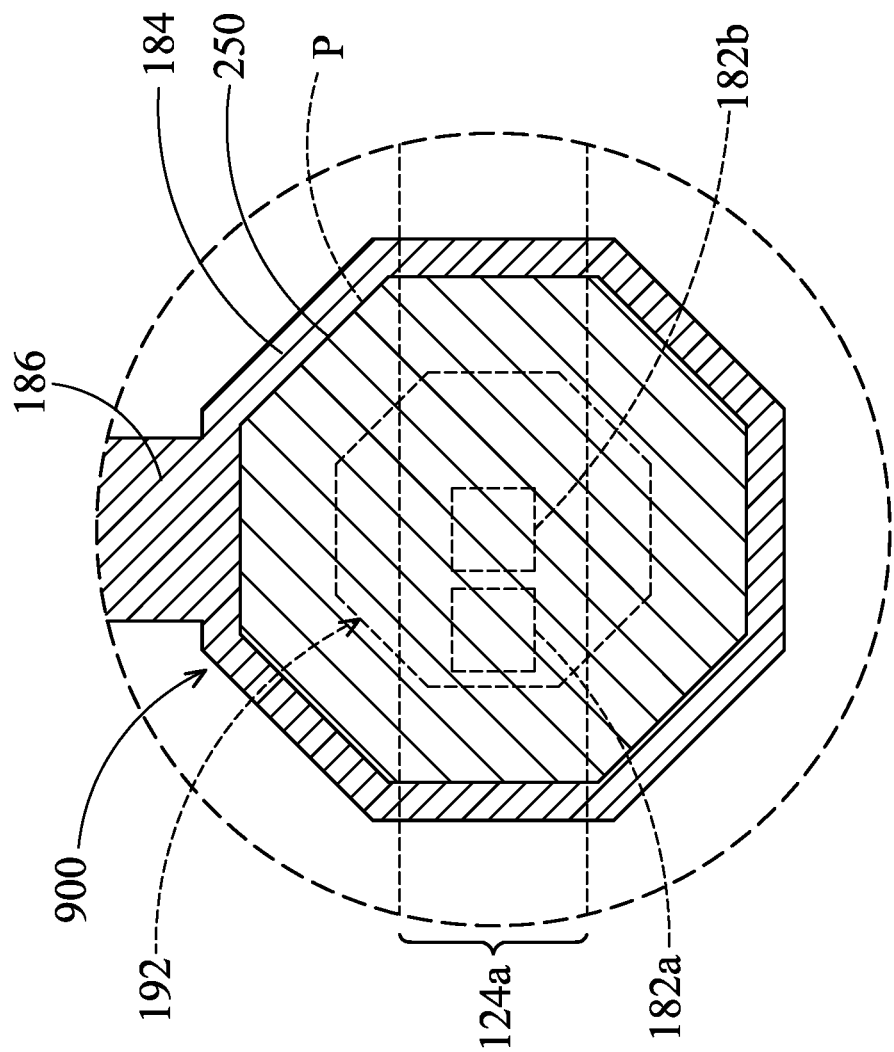
FIG. 9 is a top view of a conductive connector and a conductive line of a chip structure, in accordance with some embodiments.

FIG. 9 is a top view of a conductive connector 900 and a conductive line 124a of a chip structure, in accordance with some embodiments. As shown in FIG. 9, the conductive connector 900 is similar to the conductive connector 101 of FIGS. 5A and 5B, except that the conductive connector 900 does not have the conductive via structure 182c of the conductive connector 101 of FIGS. 5A and 5B, in accordance with some embodiments.

Figure 10:
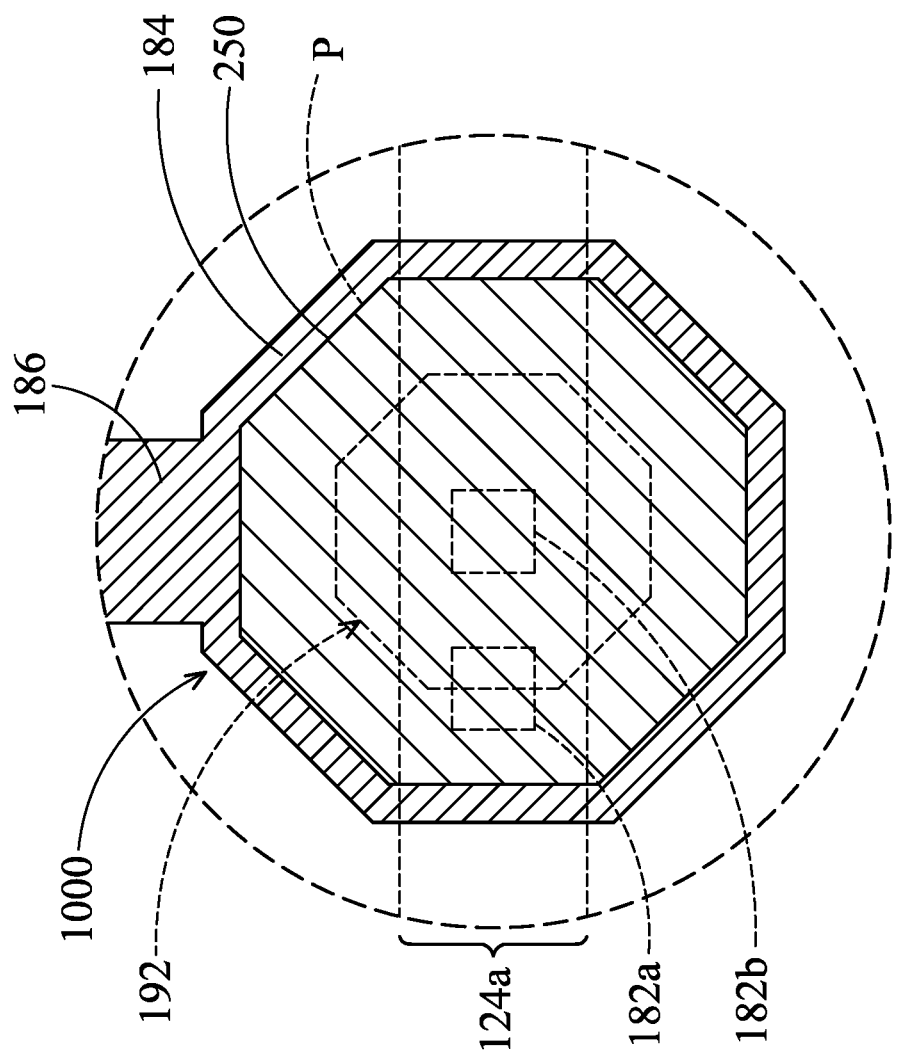
FIG. 10 is a top view of a conductive connector and a conductive line of a chip structure, in accordance with some embodiments.

FIG. 10 is a top view of a conductive connector 1000 and a conductive line 124a of a chip structure, in accordance with some embodiments. As shown in FIG. 10, the conductive connector 1000 is similar to the conductive connector 101 of FIGS. 1J and 1J-1, except that the conductive connector 1000 does not have the conductive via structure 182c of the conductive connector 101 of FIGS. 1J and 1J-1, in accordance with some embodiments.

Figure 11:
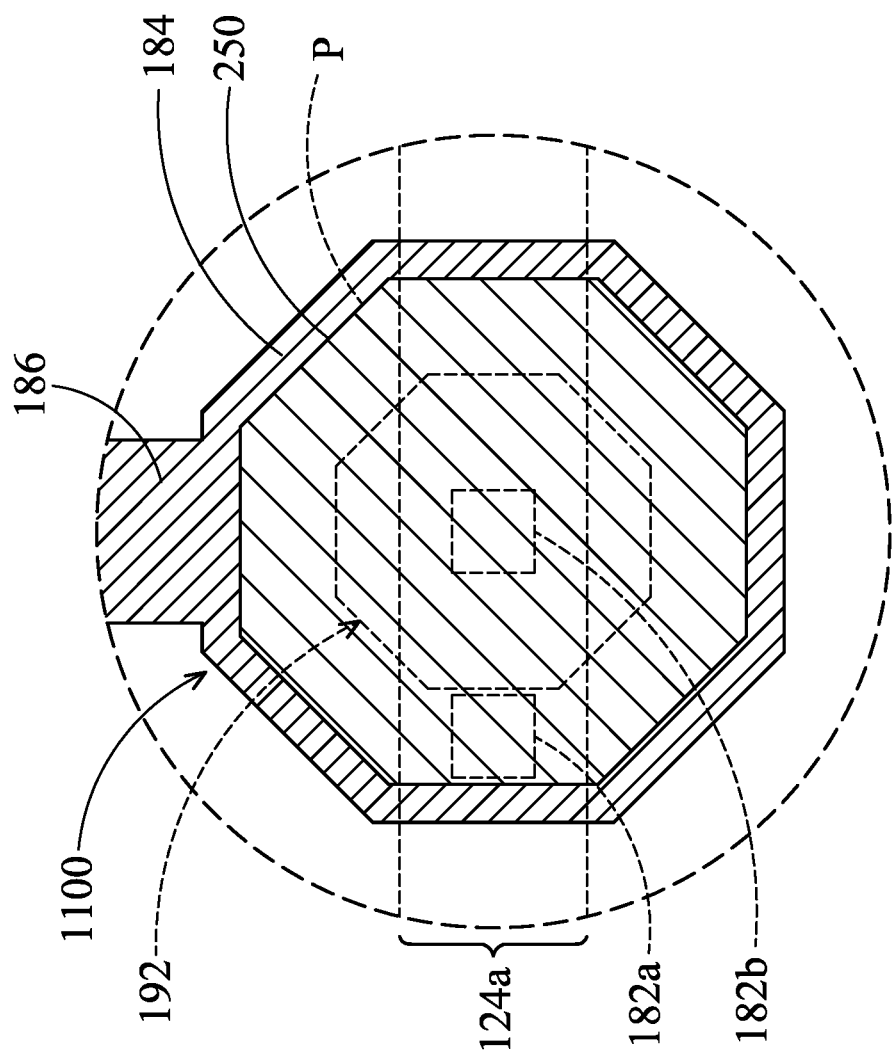
FIG. 11 is a top view of a conductive connector and a conductive line of a chip structure, in accordance with some embodiments.

FIG. 11 is a top view of a conductive connector 1100 and a conductive line 124a of a chip structure, in accordance with some embodiments. As shown in FIG. 11, the conductive connector 1100 is similar to the conductive connector 101 of FIGS. 7A and 7B, except that the conductive connector 1100 does not have the conductive via structure 182c of the conductive connector 101 of FIGS. 7A and 7B, in accordance with some embodiments.

Figure 12:
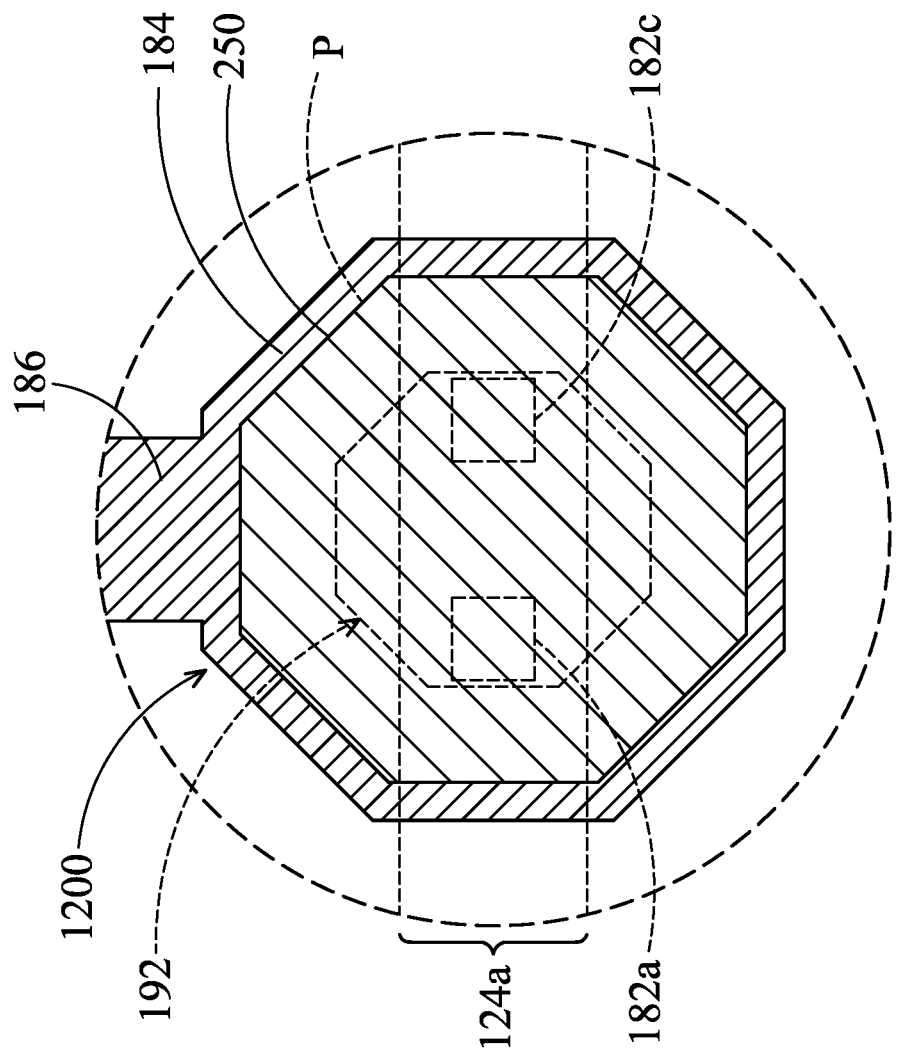
FIG. 12 is a top view of a conductive connector and a conductive line of a chip structure, in accordance with some embodiments.

FIG. 12 is a top view of a conductive connector 1200 and a conductive line 124a of a chip structure, in accordance with some embodiments. As shown in FIG. 12, the conductive connector 1200 is similar to the conductive connector 101 of FIGS. 5A and 5B, except that the conductive connector 1200 does not have the conductive via structure 182b of the conductive connector 101 of FIGS. 5A and 5B, in accordance with some embodiments.

Figure 13:
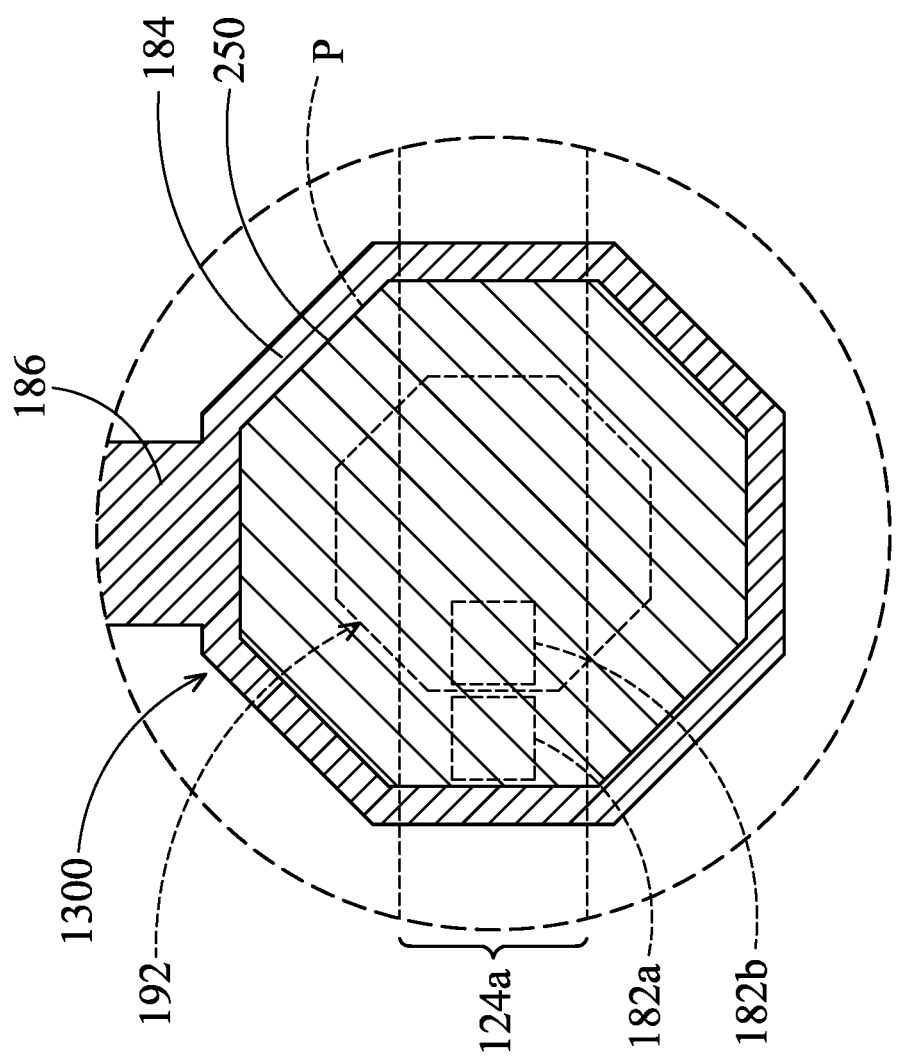
FIG. 13 is a top view of a conductive connector and a conductive line of a chip structure, in accordance with some embodiments.

FIG. 13 is a top view of a conductive connector 1300 and a conductive line 124a of a chip structure, in accordance with some embodiments. As shown in FIG. 13, the conductive connector 1300 is similar to the conductive connector 101 of FIGS. 8A and 8B, except that the conductive connector 1300 does not have the conductive via structure 182c of the conductive connector 101 of FIGS. 8A and 8B, in accordance with some embodiments.

Figure 14:
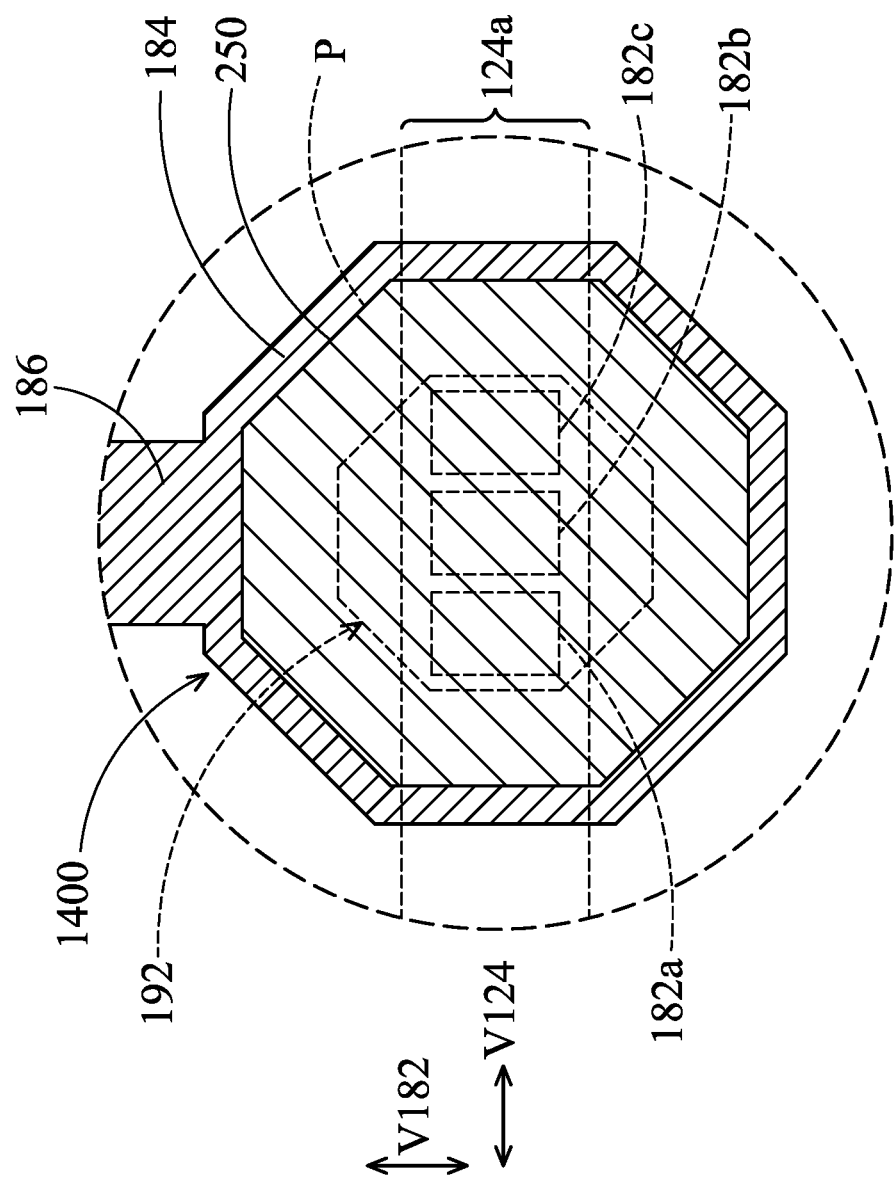
FIG. 14 is a top view of a conductive connector and a conductive line of a chip structure, in accordance with some embodiments.

FIG. 14 is a top view of a conductive connector 1400 and a conductive line 124a of a chip structure, in accordance with some embodiments. As shown in FIG. 14, the conductive connector 1400 is similar to the conductive connector 101 of FIGS. 5A and 5B, except that the conductive via structures 182a, 182b, and 182c of the conductive connector 1400 have a rectangle shape, in accordance with some embodiments. The longitudinal axis V182 of the conductive via structures 182a, 182b, and 182c is substantially perpendicular to the longitudinal axis V124 of the conductive line 124a, in accordance with some embodiments.

Figure 15:
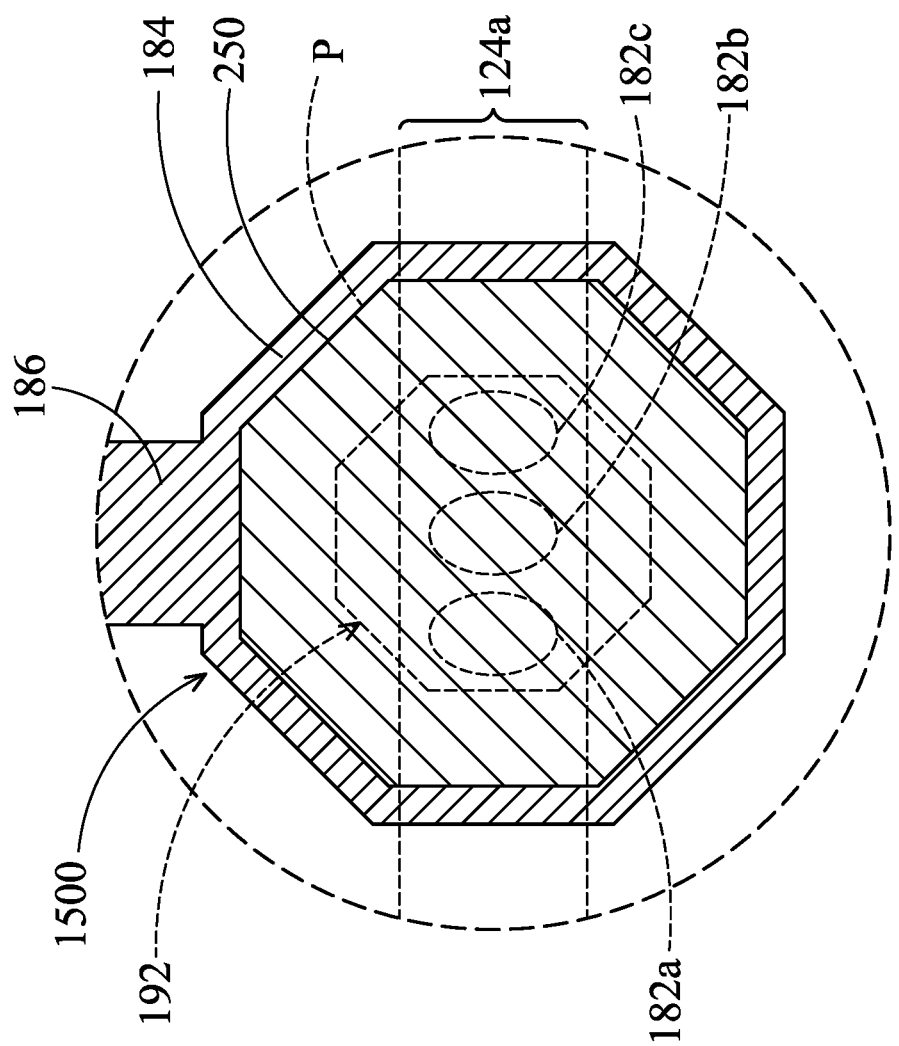
FIG. 15 is a top view of a conductive connector and a conductive line of a chip structure, in accordance with some embodiments.

FIG. 15 is a top view of a conductive connector 1500 and a conductive line 124a of a chip structure, in accordance with some embodiments. As shown in FIG. 15, the conductive connector 1500 is similar to the conductive connector 1400 of FIG. 14, except that the conductive via structures 182a, 182b, and 182c of the conductive connector 1500 have an oval shape, in accordance with some embodiments.

Figure 16:
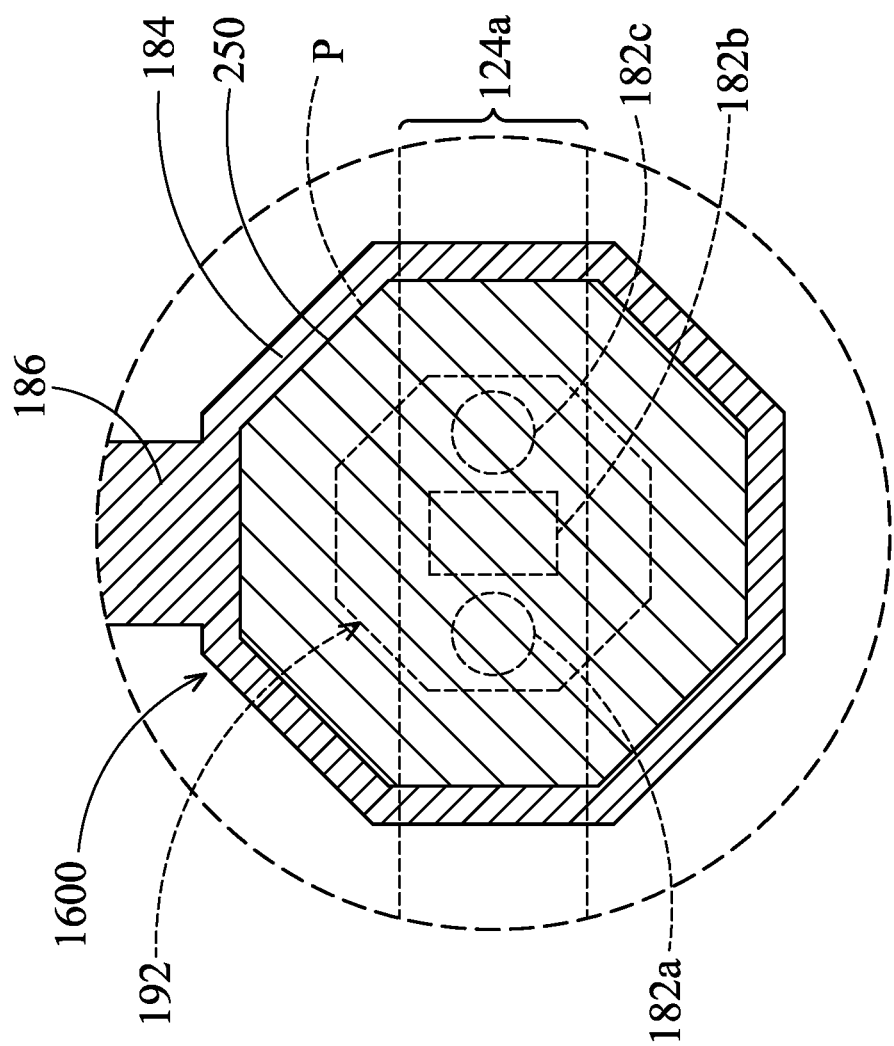
FIG. 16 is a top view of a conductive connector and a conductive line of a chip structure, in accordance with some embodiments.

FIG. 16 is a top view of a conductive connector 1600 and a conductive line 124a of a chip structure, in accordance with some embodiments. As shown in FIG. 16, the conductive connector 1600 is similar to the conductive connector 1400 of FIG. 14, except that the conductive via structures 182a and 182c of the conductive connector 1600 have a round shape, in accordance with some embodiments. The conductive via structure 182b has a rectangle shape, which is different from that of the conductive via structures 182a and 182c, in accordance with some embodiments.

Figure 17:
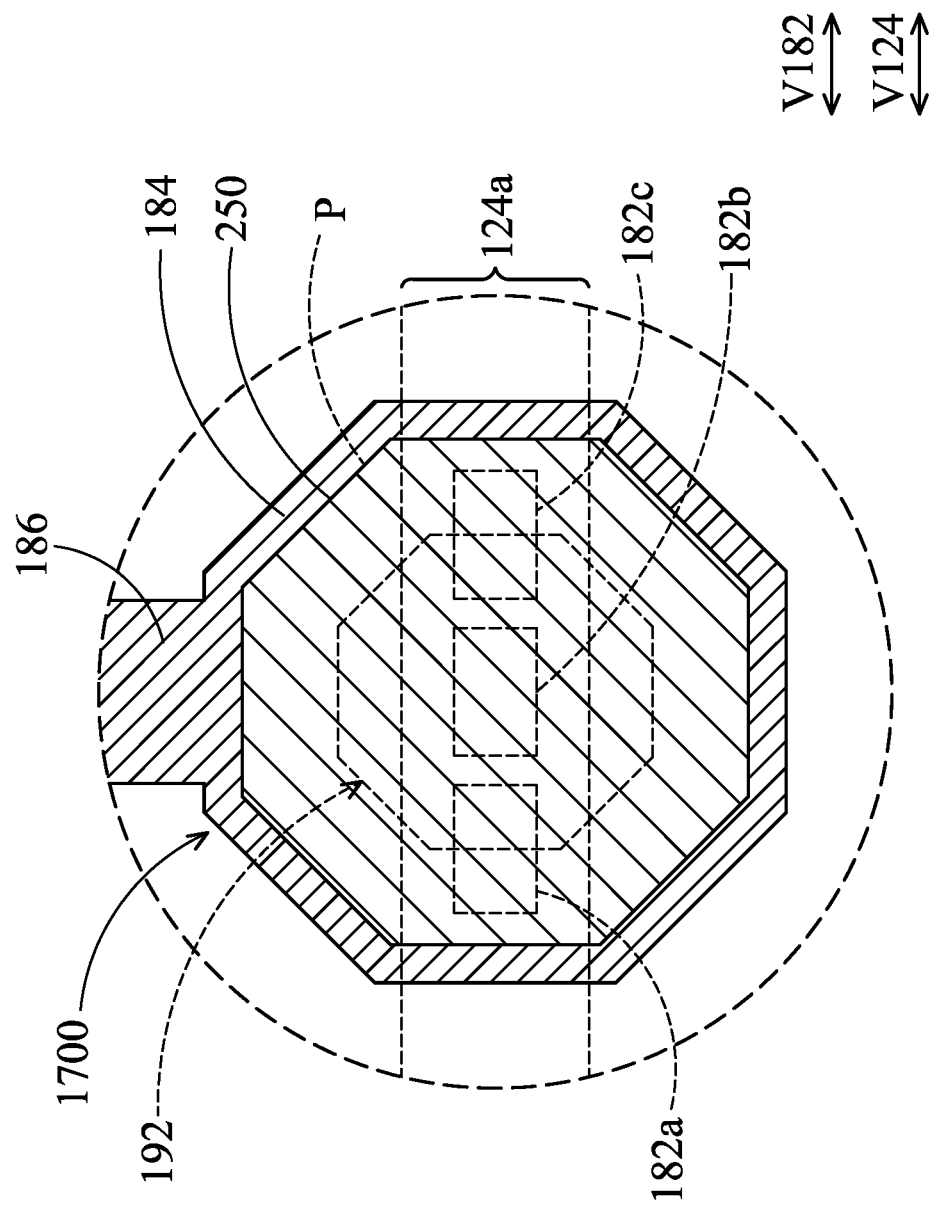
FIG. 17 is a top view of a conductive connector and a conductive line of a chip structure, in accordance with some embodiments.

FIG. 17 is a top view of a conductive connector 1700 and a conductive line 124a of a chip structure, in accordance with some embodiments. As shown in FIG. 17, the conductive connector 1700 is similar to the conductive connector 1400 of FIG. 14, except that the longitudinal axis V182 of the conductive via structures 182a, 182b, and 182c of the conductive connector 1700 is substantially parallel to the longitudinal axis V124 of the conductive line 124a, in accordance with some embodiments.

Figure 18:
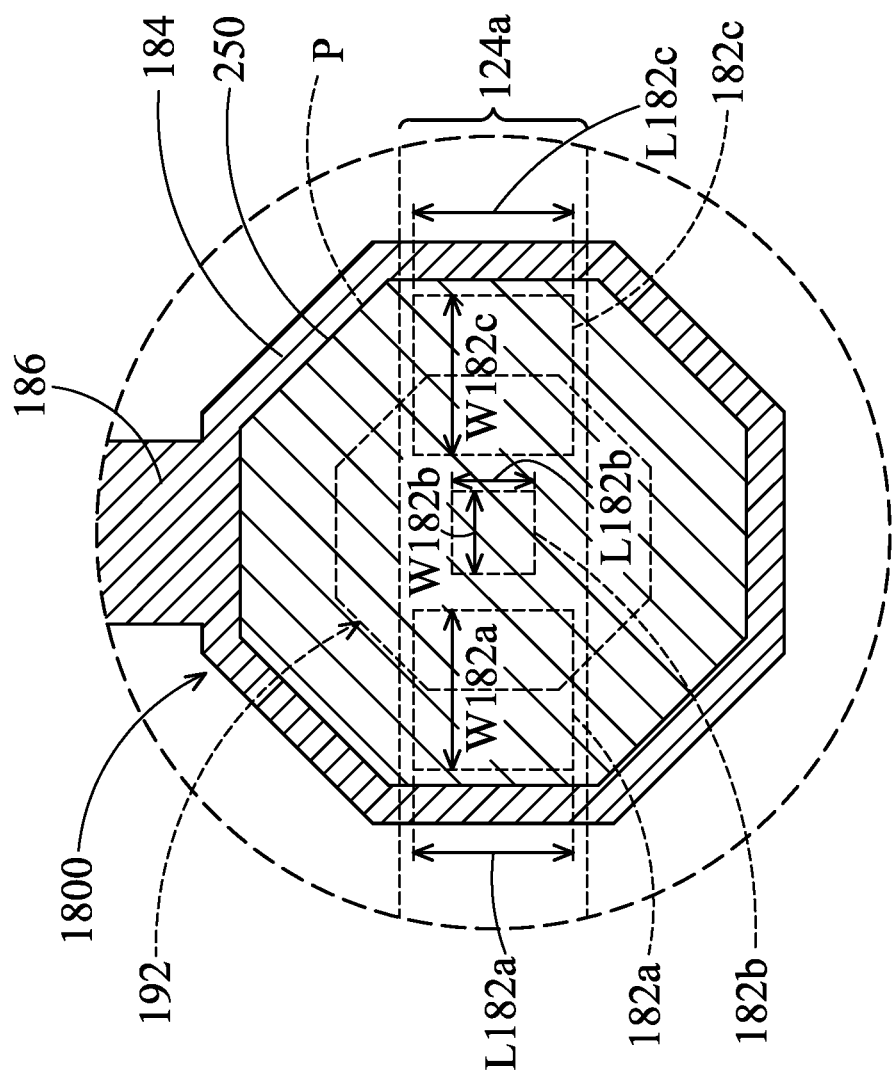
FIG. 18 is a top view of a conductive connector and a conductive line of a chip structure, in accordance with some embodiments.

FIG. 18 is a top view of a conductive connector 1800 and a conductive line 124a of a chip structure, in accordance with some embodiments. As shown in FIG. 18, the conductive connector 1800 is similar to the conductive connector 101 of FIGS. 1J and 1J-1, except that the conductive via structures 182a and 182c are both larger than the conductive via structure 182b, in accordance with some embodiments.

That is, the width W182a of the conductive via structure 182a and the width W182c of the conductive via structure 182c are both greater than the width W182b of the conductive via structure 182b, in accordance with some embodiments. The length L182a of the conductive via structure 182a and the length L182c of the conductive via structure 182c are both greater than the length L182b of the conductive via structure 182b, in accordance with some embodiments.

Figure 19:
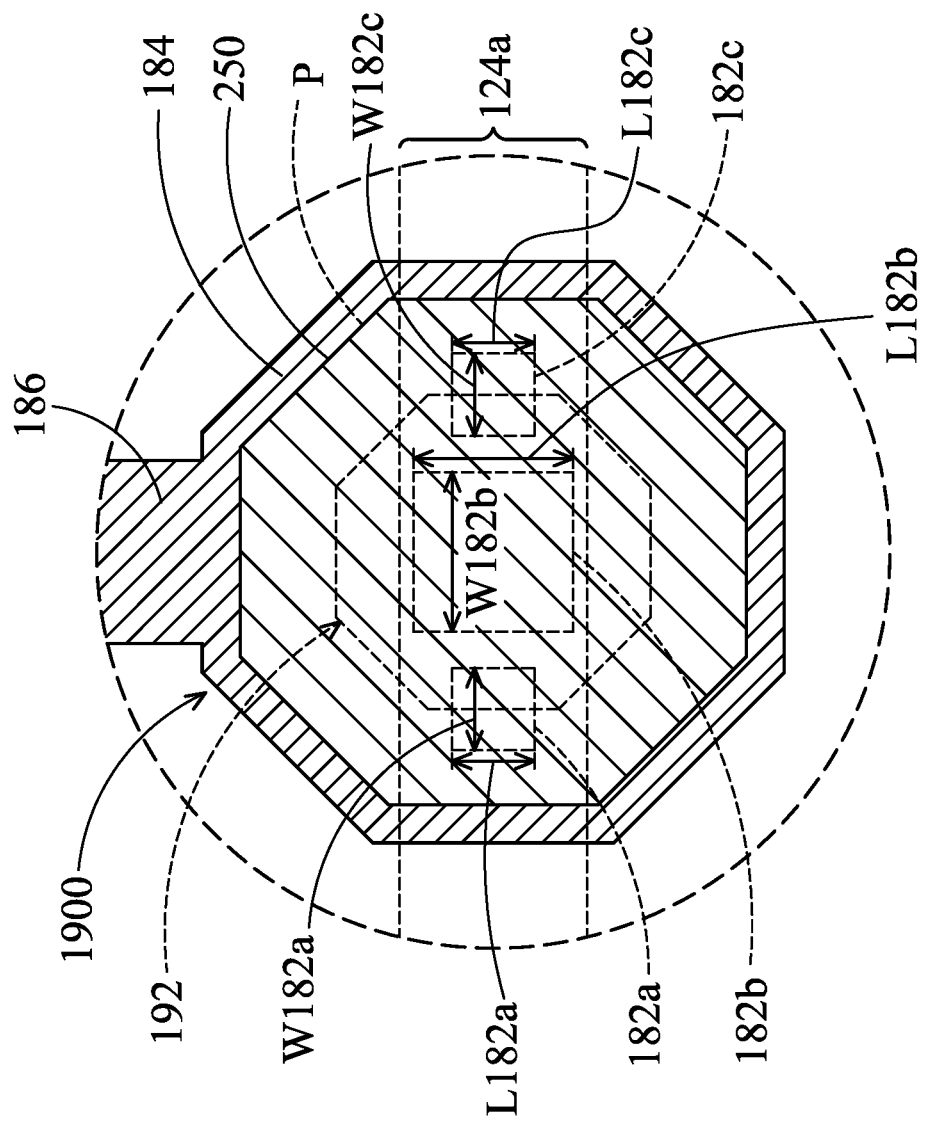
FIG. 19 is a top view of a conductive connector and a conductive line of a chip structure, in accordance with some embodiments.

FIG. 19 is a top view of a conductive connector 1900 and a conductive line 124a of a chip structure, in accordance with some embodiments. As shown in FIG. 19, the conductive connector 1900 is similar to the conductive connector 101 of FIGS. 1J and 1J-1, except that the conductive via structures 182a and 182c are both smaller than the conductive via structure 182b, in accordance with some embodiments.

That is, the width W182a of the conductive via structure 182a and the width W182c of the conductive via structure 182c are both less than the width W182b of the conductive via structure 182b, in accordance with some embodiments. The length L182a of the conductive via structure 182a and the length L182c of the conductive via structure 182c are both less than the length L182b of the conductive via structure 182b, in accordance with some embodiments.

Figure 20:
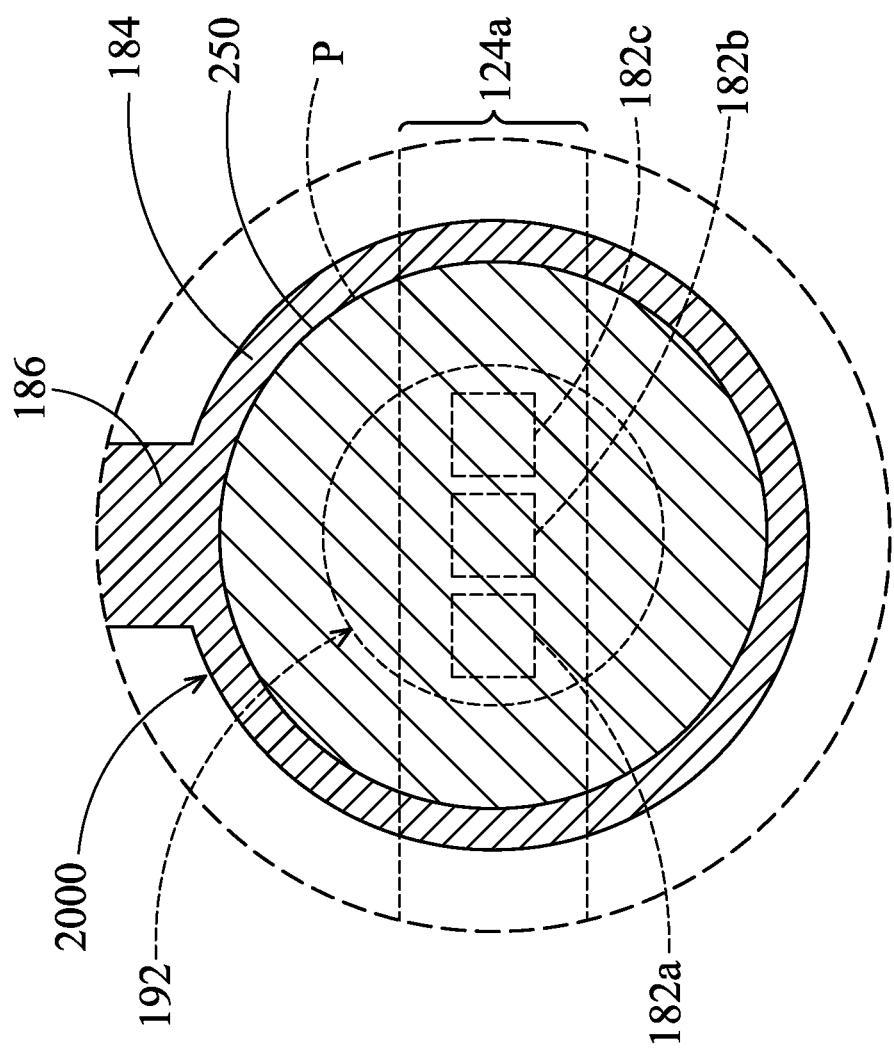
FIG. 20 is a top view of a conductive connector and a conductive line of a chip structure, in accordance with some embodiments.

FIG. 20 is a top view of a conductive connector 2000 and a conductive line 124a of a chip structure, in accordance with some embodiments. As shown in FIG. 20, the conductive connector 2000 is similar to the conductive connector 101 of FIGS. 5A and 5B, except that the conductive pad 184, the conductive pillar P, the solder bump 250, and the opening 192 have a round shape, in accordance with some embodiments.

Figure 21:
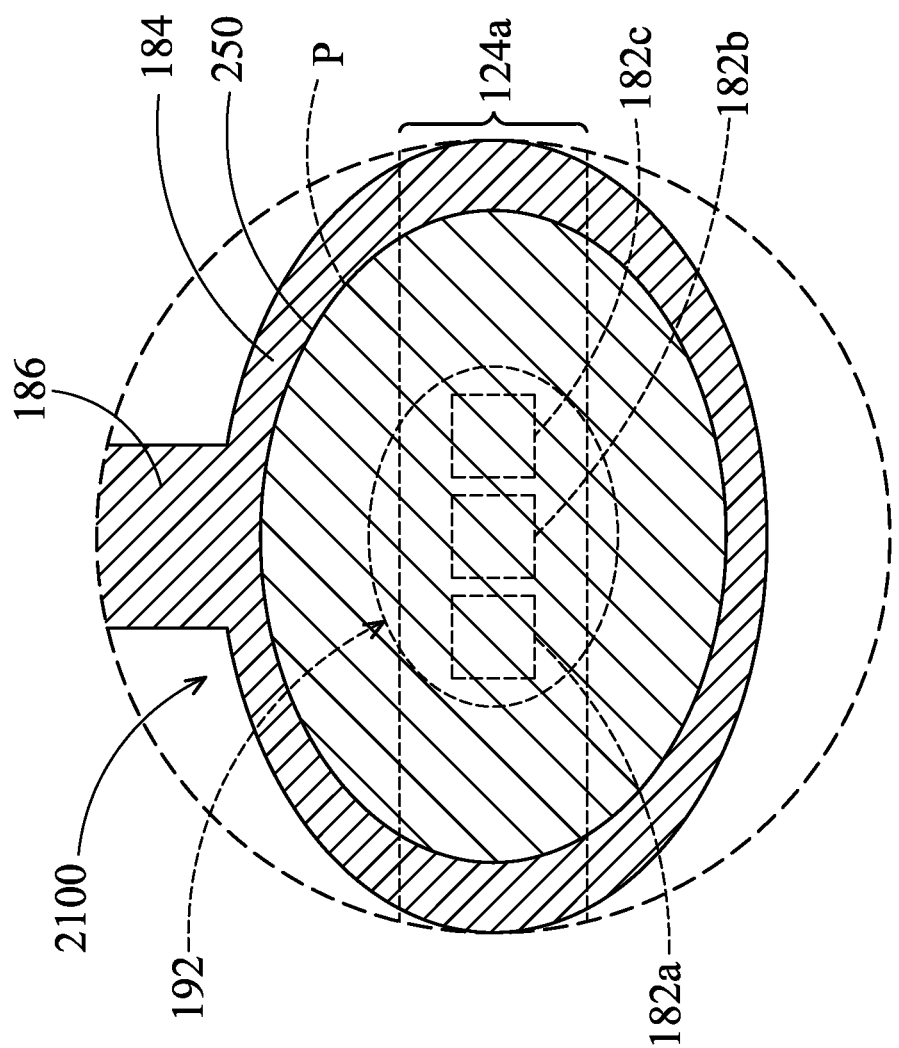
FIG. 21 is a top view of a conductive connector and a conductive line of a chip structure, in accordance with some embodiments.

FIG. 21 is a top view of a conductive connector 2100 and a conductive line 124a of a chip structure, in accordance with some embodiments. As shown in FIG. 21, the conductive connector 2100 is similar to the conductive connector 101 of FIGS. 5A and 5B, except that the conductive pad 184, the conductive pillar P, the solder bump 250, and the opening 192 have an oval shape, in accordance with some embodiments.

Figure 22:
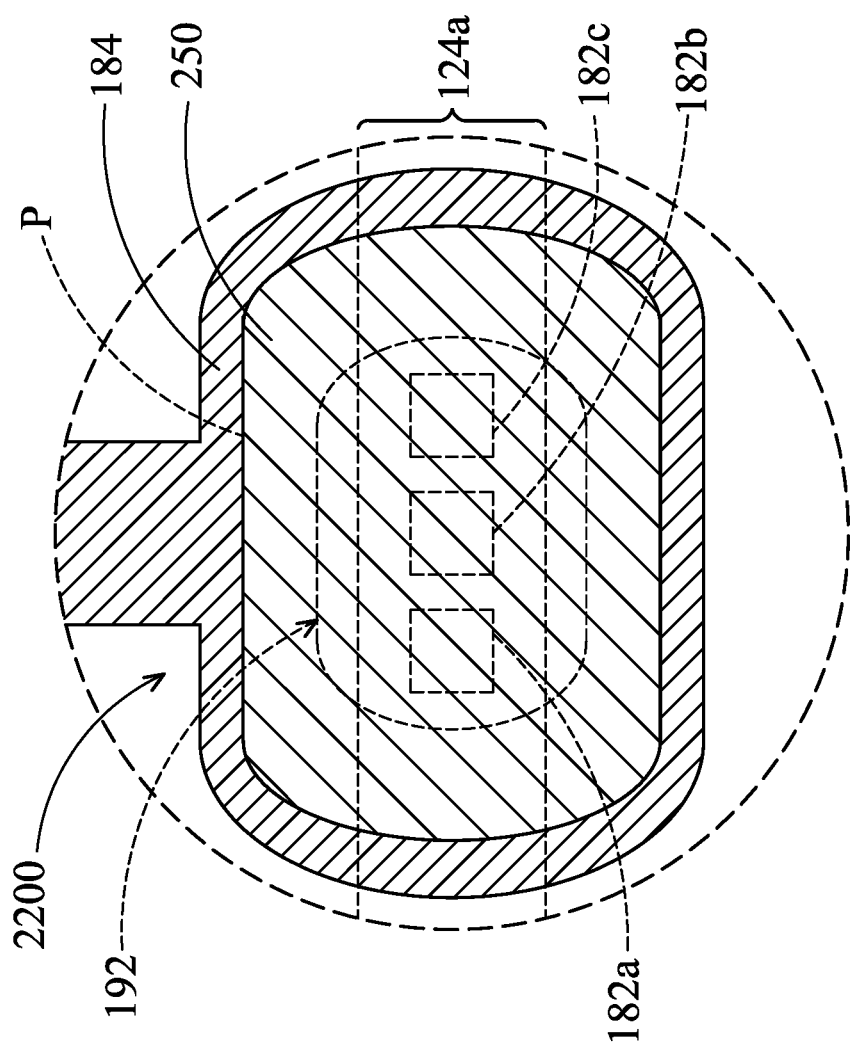
FIG. 22 is a top view of a conductive connector and a conductive line of a chip structure, in accordance with some embodiments.

FIG. 22 is a top view of a conductive connector 2200 and a conductive line 124a of a chip structure, in accordance with some embodiments. As shown in FIG. 22, the conductive connector 2200 is similar to the conductive connector 101 of FIGS. 5A and 5B, except that the conductive pad 184, the conductive pillar P, the solder bump 250, and the opening 192 have an oval-like shape, in accordance with some embodiments.

Figure 23A:
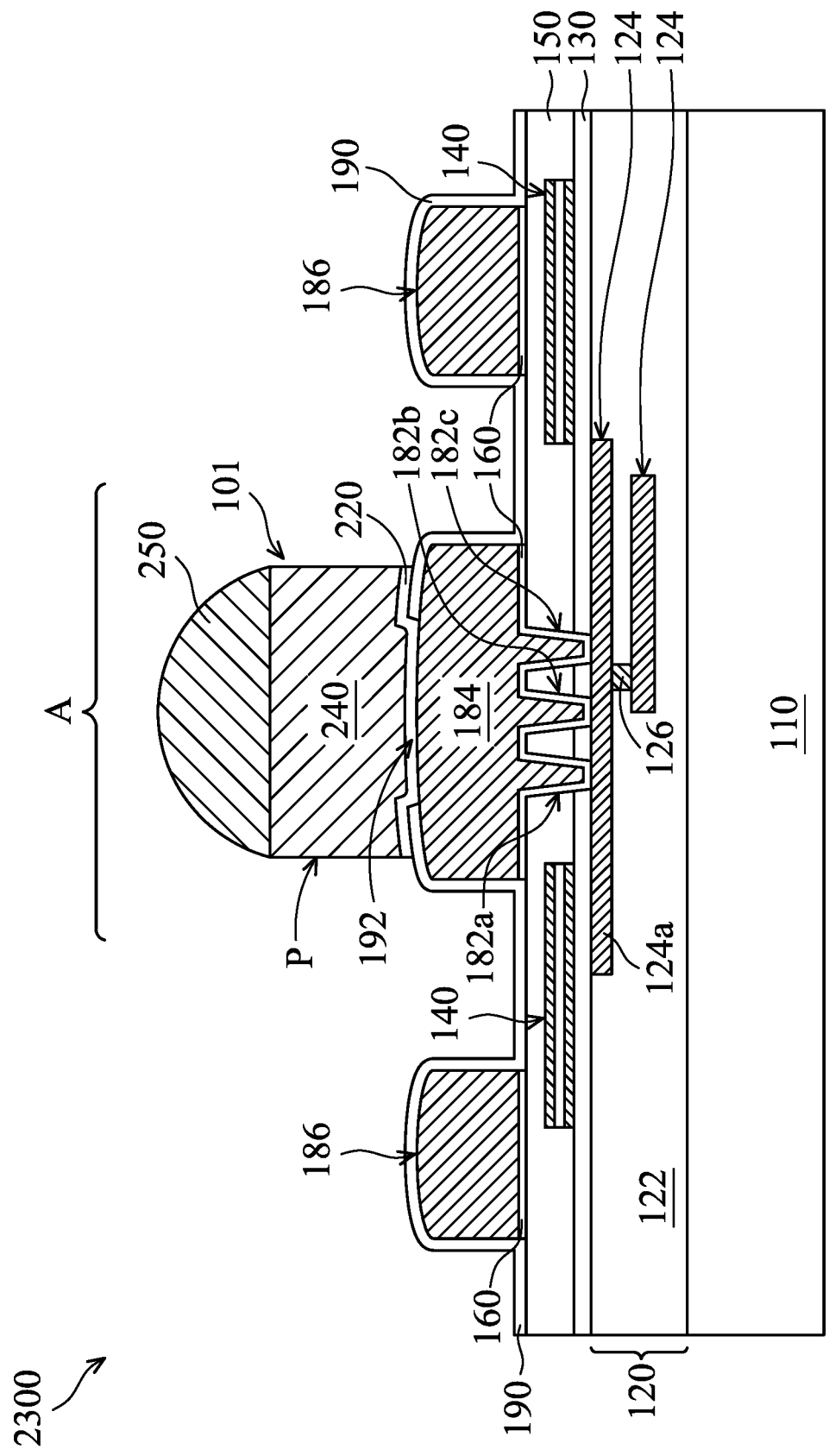
FIG. 23A is a cross-sectional view of a first portion of a chip structure, in accordance with some embodiments.
Figure 23B:
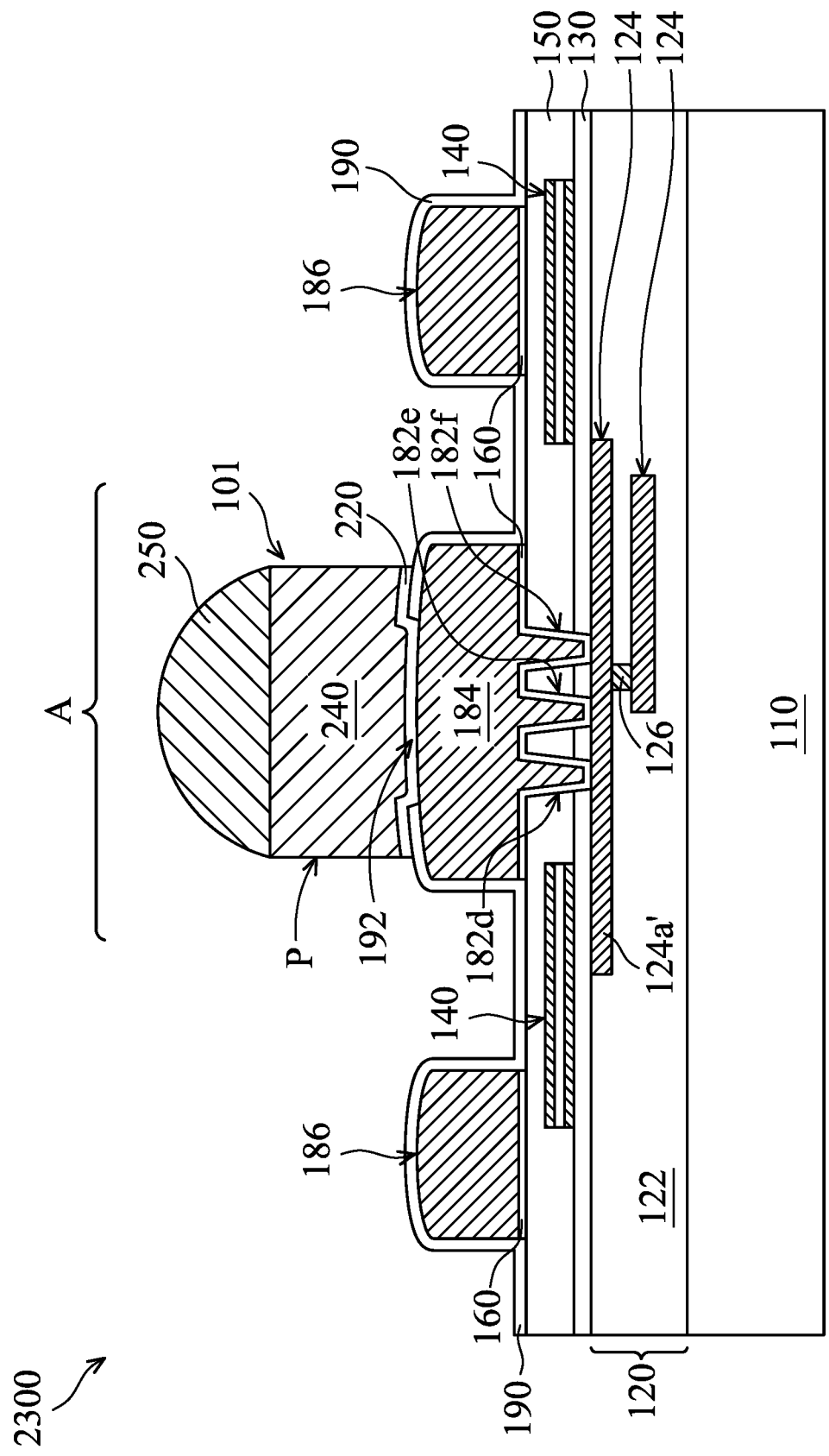
FIG. 23B is a cross-sectional view of a second portion of the chip structure of FIG. 23A, in accordance with some embodiments.
Figure 23C:
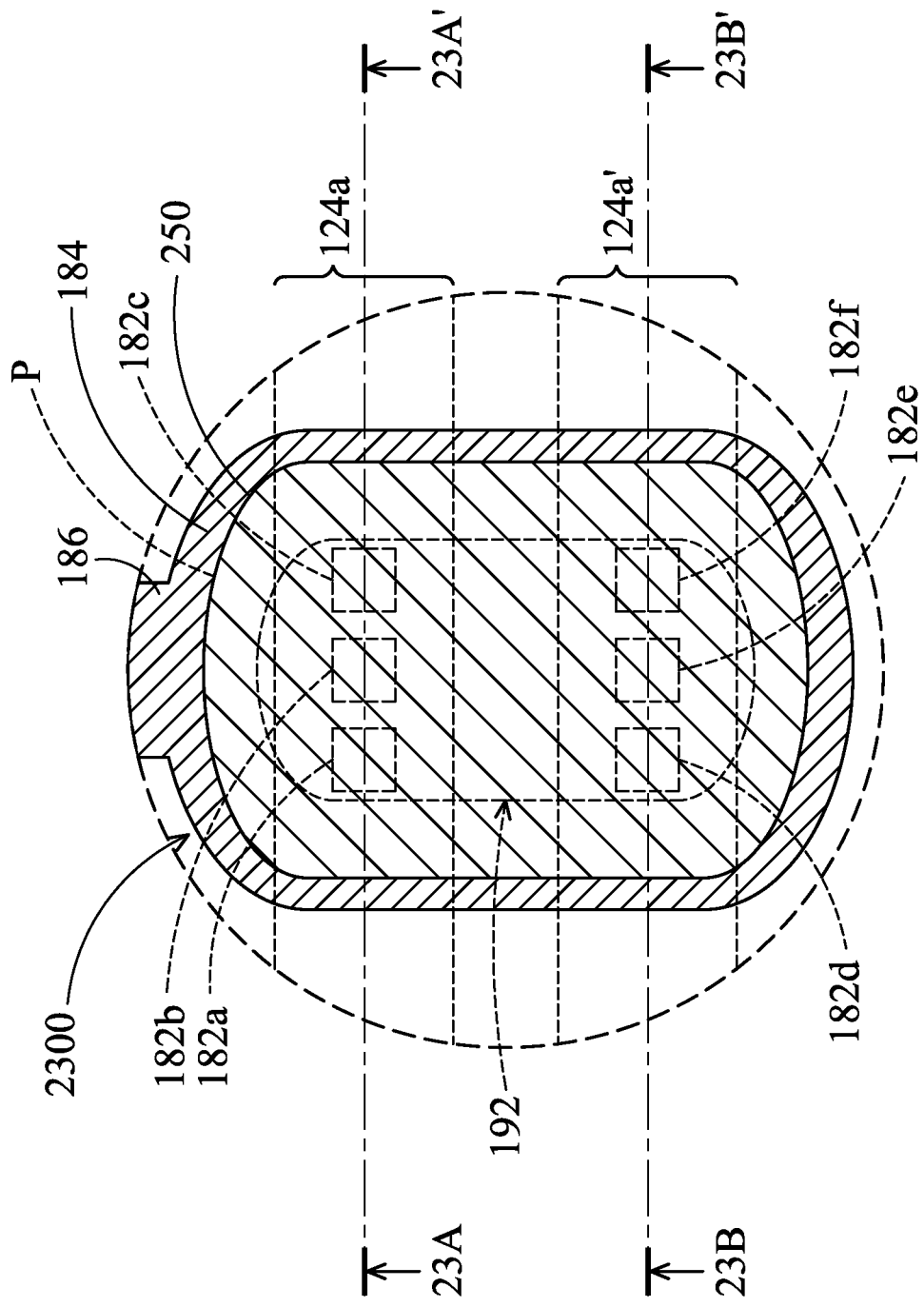
FIG. 23C is a top view of a region of the chip structure of FIGS. 23A and 23B, in accordance with some embodiments.

FIG. 23A is a cross-sectional view of a first portion of a chip structure 2300, in accordance with some embodiments. FIG. 23B is a cross-sectional view of a second portion of the chip structure 2300 of FIG. 23A, in accordance with some embodiments. FIG. 23C is a top view of a region A of the chip structure 2300 of FIGS. 23A and 23B, in accordance with some embodiments. The region A of FIG. 23A shows a cross-sectional view illustrating the chip structure 2300 along a sectional line 23A-23A' in FIG. 23C, in accordance with some embodiments. The region A of FIG. 23B shows a cross-sectional view illustrating the chip structure 2300 along a sectional line 23B-23B' in FIG. 23C, in accordance with some embodiments.

As shown in FIGS. 23A, 23B and 23C, the chip structure 2300 is similar to the chip structure 500 of FIGS. 5A and 5B, except that the chip structure 2300 further includes conductive via structures 182d, 182e, and 182f connected between the conductive pad 184 and a conductive line 124a' of the topmost wiring layer 124, in accordance with some embodiments. The conductive pad 184 overlaps the conductive lines 124a and 124a', in accordance with some embodiments. The conductive pad 184 are connected to the conductive lines 124a and 124a' through the conductive via structures 182a, 182b, 182c, 182d, 182e, and 182f, in accordance with some embodiments. The conductive via structures 182d, 182e, and 182f pass through the passivation layers 130 and 150, in accordance with some embodiments.

Figure 24:
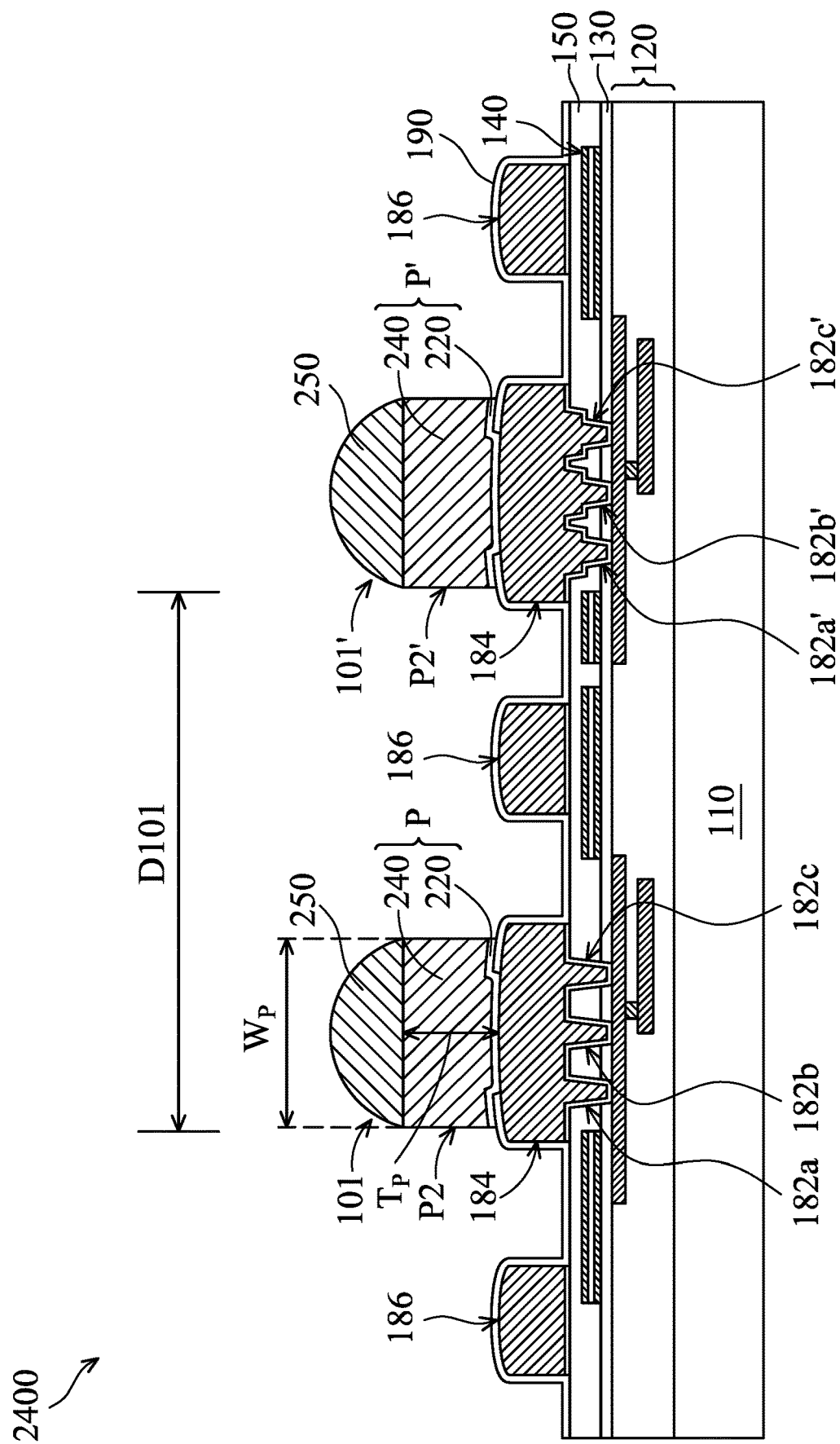
FIG. 24 is a cross-sectional view of a chip structure, in accordance with some embodiments.

FIG. 24 is a cross-sectional view of a chip structure 2400, in accordance with some embodiments. As shown in FIG. 24, the chip structure 2400 is similar to the chip structure 100 of FIG. 1J, except that the chip structure 2400 further includes a conductive connector 101', in accordance with some embodiments.

The conductive connector 101' is similar to the conductive connector 101, except that the conductive via structures 182a', 182b', and 182c' of the conductive connector 101' have a ladder-like shape, which is different from that of the conductive via structures 182a, 182b, and 182c of the conductive connector 101, in accordance with some embodiments.

The conductive pillar P of the conductive connector 101 has a sidewall P2 facing away from the conductive connector 101', in accordance with some embodiments. The conductive pillar P' of the conductive connector 101' has a sidewall P2' facing the conductive connector 101, in accordance with some embodiments. In some embodiments, a distance D101 between the sidewalls P2 and P2' ranges from about 10 μm to about 50 μm. The conductive pillar P has a thickness $T_P$ ranging from about 5 μm to about 17 μm, in accordance with some embodiments. The conductive pillar P has a width $W_P$ ranging from about 5 μm to about 22 μm, in accordance with some embodiments.

Figure 25:
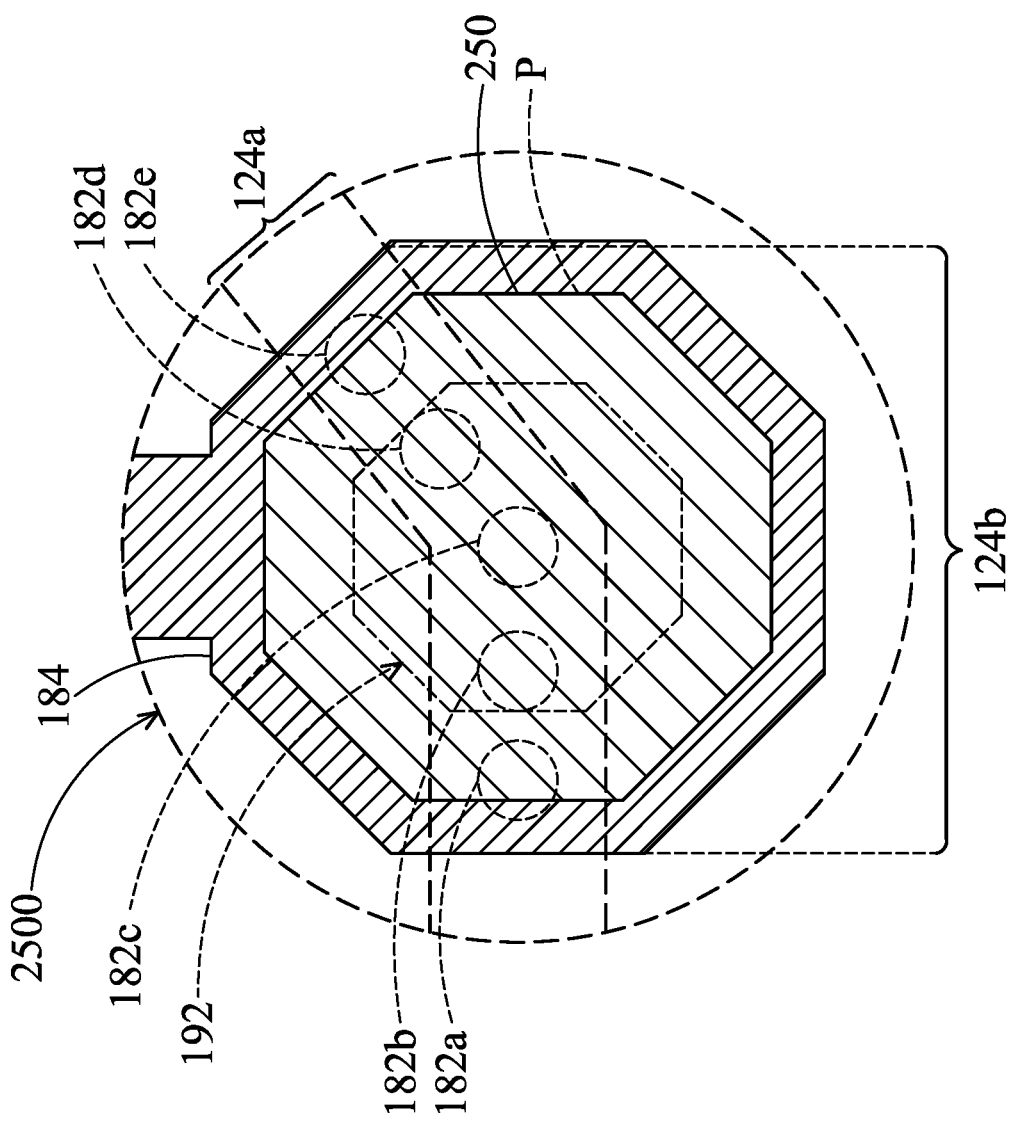
FIG. 25 is a top view of a conductive connector and a conductive line of a chip structure, in accordance with some embodiments.

FIG. 25 is a top view of a conductive connector 2500 and a conductive line 124a of a chip structure, in accordance with some embodiments. As shown in FIG. 25, the conductive connector 2500 is similar to the conductive connector 101 of FIG. 1J, except that the conductive pad 184 of the conductive connector 2500 overlaps a bending portion 124b of the conductive line 124a, in accordance with some embodiments.

The conductive connector 2500 further includes conductive via structures 182d and 182e connected between the conductive pad 184 and the conductive line 124a, in accordance with some embodiments. The conductive via structures 182a, 182b, 182c, 182d and 182e are arranged along the bending portion 124b, in accordance with some embodiments.

Processes and materials for forming the chip structures 200, 300, 400, 500, 600, 700, 800 and 2400 may be similar to, or the same as, those for forming the chip structure 100 described above. Processes and materials for forming the conductive connectors 900, 1000, 1100, 1200, 1300, 1400, 1500, 1600, 1700, 1800, 1900, 2000, 2100, 2200, and 2500 may be similar to, or the same as, those for forming the conductive connector 101 described above.

The chip structures 100, 200, 300, 400, 500, 600, 700, 800 and 2400 and the conductive connectors 900, 1000, 1100, 1200, 1300, 1400, 1500, 1600, 1700, 1800, 1900, 2000, 2100, 2200, and 2500 may be designed according to different requirements.

In accordance with some embodiments, chip structures and methods for forming the same are provided. The methods (for forming the chip structure) form multiple conductive via structures connected between a conductive pad and a conductive line. The conductive via structures are able to share the bonding stress from the conductive pad during a subsequent bonding process. Therefore, the conductive via structures are able to prevent the bonding stress from concentrating in only one conductive via structure, which improves the reliability of the chip structure. The conductive via structures may provide more support force than only one conductive via structure, and therefore the conductive via structures may reduce the bonding stress applied to passivation layers under the conductive pad, which prevents the passivation layers from cracking and/or delamination.

In accordance with some embodiments, a chip structure is provided. The chip structure includes a substrate. The chip structure includes a conductive line over the substrate. The chip structure includes a first passivation layer over the substrate and the conductive line. The chip structure includes a conductive pad over the first passivation layer covering the conductive line. The conductive pad is thicker and wider than the conductive line. The chip structure includes a first conductive via structure and a second conductive via structure passing through the first passivation layer and directly connected between the conductive pad and the conductive line. The chip structure includes a conductive pillar over the conductive pad.

In accordance with some embodiments, a chip structure is provided. The chip structure includes a substrate. The chip structure includes a first conductive line over the substrate. The chip structure includes a first passivation layer over the substrate and the first conductive line. The chip structure includes a conductive pad over the first passivation layer. The conductive pad overlaps a first portion of the first conductive line. The chip structure includes a first conductive via structure and a second conductive via structure passing through the first passivation layer and connected between the conductive pad and the first conductive line. The conductive pad is thicker than the first conductive via structure. The first conductive via structure and the second conductive via structure are arranged along the first portion of the first conductive line under the conductive pad. The chip structure includes a conductive pillar on the conductive pad.

In accordance with some embodiments, a method for forming a chip structure is provided. The method includes forming a conductive line over a substrate. The method includes forming a first passivation layer over the substrate and the conductive line. The method includes forming a first through hole and a second through hole in the first passivation layer over the conductive line to expose first portions of the conductive line. The method includes forming a first conductive via structure, a second conductive via structure, and a conductive pad over the conductive line. The first conductive via structure and the second conductive via structure are respectively in the first through hole and the second through hole, the conductive pad is over the first conductive via structure, the second conductive via structure, and the first passivation layer, and the conductive pad is thicker and wider than the conductive line. The method includes forming a conductive pillar over the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip structure, comprising:
   forming a conductive line over a substrate;
   forming a first passivation layer over the substrate and the conductive line;
   forming a first through hole and a second through hole in the first passivation layer over the conductive line to expose first portions of the conductive line;
   forming a first conductive via structure, a second conductive via structure, and a conductive pad over the conductive line, wherein the first conductive via structure and the second conductive via structure are respectively in the first through hole and the second through hole, the conductive pad is over the first conductive via structure, the second conductive via structure, and the first passivation layer, the conductive pad is thicker and wider than the conductive line, and the conductive pad has a curved top surface;
   forming a second passivation layer over the first passivation layer and the conductive pad, wherein the second passivation layer has an opening exposing a second portion of the conductive pad, the second passivation layer conformally and continuously covers a first top surface and a sidewall of the conductive pad, and the first top surface is higher than a second top surface of a portion of the second passivation layer covering the first passivation layer; and
   forming a conductive pillar over the conductive pad, wherein the conductive pillar is over the second passivation layer and fills the opening, and the conductive pillar has a curved bottom surface facing the curved top surface of the conductive pad.

2. The method for forming the chip structure as claimed in claim 1, wherein the second passivation layer overlaps the first conductive via structure.

3. The method for forming the chip structure as claimed in claim 1, wherein the forming of the first conductive via structure, the second conductive via structure, and the conductive pad over the conductive line comprises:
   electroplating a conductive layer over the first passivation layer and in the first through hole and the second through hole, wherein the conductive layer over the first passivation layer forms the conductive pad, the conductive layer in the first through hole and the second through hole forms the first conductive via structure and the second conductive via structure, and the conductive layer comprises copper.

4. The method for forming the chip structure as claimed in claim 3, wherein the first conductive via structure and the second conductive via structure are arranged along a portion of the conductive line under the conductive pad.

5. The method for forming the chip structure as claimed in claim 1, wherein the first conductive via structure and the second conductive via structure have different shapes.

6. The method for forming the chip structure as claimed in claim 1, wherein a center portion of the conductive pad is directly on the first conductive via structure.

7. The method for forming the chip structure as claimed in claim 1, wherein a center portion of the conductive pad is between the first conductive via structure and the second conductive via structure.

8. The method for forming the chip structure as claimed in claim 7, further comprising:
forming a third conductive via structure over the conductive line while forming the first conductive via structure, the second conductive via structure, and the conductive pad over the conductive line, wherein the third conductive via structure is between the first conductive via structure and the second conductive via structure and directly under the center portion of the conductive pad.

9. The method for forming the chip structure as claimed in claim 1, wherein the curved top surface of the conductive pad comprises a convex curved surface, and the curved bottom surface of the conductive pillar comprises a concave curved surface.

10. A method for forming a chip structure, comprising:
forming a conductive line over a substrate, wherein the conductive line has a bending portion, the bending portion has a first strip part and a second strip part, and the first strip part is not parallel to the second strip part in a top view of the conductive line;
forming a first passivation layer over the substrate and the conductive line;
forming a first conductive via structure, a second conductive via structure, and a conductive pad over the conductive line, wherein
the first conductive via structure and the second conductive via structure pass through the first passivation layer and are connected to the first strip part and the second strip part respectively, the conductive pad is over the first conductive via structure, the second conductive via structure, and the bending portion, the conductive pad is thicker than the first conductive via structure, and the first conductive via structure and the second conductive via structure are arranged along the first conductive line; and
forming a conductive pillar over the conductive pad.

11. The method for forming the chip structure as claimed in claim 10, wherein the first conductive via structure and a center portion of the conductive pad are misaligned in a direction perpendicular to a top surface of the substrate.

12. The method for forming the chip structure as claimed in claim 11, wherein the second conductive via structure and the center portion of the conductive pad are misaligned in the direction perpendicular to the top surface of the substrate.

13. The method for forming the chip structure as claimed in claim 11, further comprising:
forming a third conductive via structure over the first strip part and the second strip part, wherein the third conductive via structure and the center portion of the conductive pad are aligned with each other in the direction.

14. The method for forming the chip structure as claimed in claim 10, further comprising:
forming a second passivation layer over the first passivation layer and the conductive pad before forming the conductive pillar over the conductive pad, wherein the conductive pillar is over and passes through the second passivation layer.

15. A method for forming a chip structure, comprising:
forming a first passivation layer over a first conductive line;
forming a first conductive via structure, a second conductive via structure, and a conductive pad over the first conductive line, wherein
the first conductive via structure and the second conductive via structure pass through the first passivation layer, the conductive pad is over the first passivation layer, the first conductive via structure, and the second conductive via structure, and the first conductive via structure has a stepped sidewall in a cross-sectional view of the first conductive via structure; and
forming a conductive pillar over the conductive pad.

16. The method for forming the chip structure as claimed in claim 15, wherein the first conductive via structure and a center portion of the conductive pad are aligned with each other in a direction perpendicular to a top surface of the substrate.

17. The method for forming the chip structure as claimed in claim 16, wherein a first width of the first conductive via structure is less than a second width of the second conductive via structure.

18. The method for forming the chip structure as claimed in claim 17, further comprising:
forming a third conductive via structure over the first conductive line while forming the first conductive via structure, the second conductive via structure, and the conductive pad over the first conductive line, wherein the first conductive via structure is between the second conductive via structure and the third conductive via structure.

19. The method for forming the chip structure as claimed in claim 15, wherein the first passivation layer is further formed over a second conductive line, and the method further comprises:
forming a third conductive via structure passing through the first passivation layer and connected to the second conductive line while forming the first conductive via structure, the second conductive via structure, and the conductive pad over the first conductive line, wherein the conductive pad covers the third conductive via structure.

20. The method for forming the chip structure as claimed in claim 15, wherein the first passivation layer further partially extends into the second conductive via structure.

* * * * *